United States Patent
Kamitani

(10) Patent No.: US 6,188,115 B1
(45) Date of Patent: Feb. 13, 2001

(54) SEMICONDUCTOR DEVICE WITH A CONDUCTIVE LAYER OF SMALL CONDUCTIVE RESISTANCE

(75) Inventor: Yoshikazu Kamitani, Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/119,047

(22) Filed: Jul. 20, 1998

(30) Foreign Application Priority Data

Jan. 30, 1998 (JP) .................................. 10-019038

(51) Int. Cl.[7] .................................................. H01L 29/76
(52) U.S. Cl. .......................... 257/412; 257/316; 257/412; 257/413; 257/414; 257/773
(58) Field of Search .................... 257/316, 412, 257/413, 414, 773

(56) References Cited

U.S. PATENT DOCUMENTS

| | | | |
|---|---|---|---|
| 5,710,453 | * 1/1998 | Bryant | 257/411 |
| 5,714,786 | * 2/1998 | Gonazalez et al. | 257/366 |
| 5,846,871 | * 12/1998 | Lee et al. | 438/592 |
| 5,852,319 | * 12/1998 | Kim et al. | 257/412 |
| 5,939,758 | * 8/1999 | Arima | 257/377 |
| 5,955,761 | * 9/1999 | Yoshitomi et al. | 257/336 |
| 5,977,561 | * 11/1999 | Wu | 257/67 |
| 5,982,001 | * 11/1999 | Wu | 257/344 |
| 5,986,312 | * 11/1999 | Kuroda | 257/382 |
| 5,990,528 | * 11/1999 | Sundaresan | 257/393 |
| 5,994,734 | * 11/1999 | Chou | 257/316 |
| 5,998,838 | * 12/1999 | Tanabe et al. | 257/347 |
| 6,013,569 | * 1/2000 | Lur et al. | 438/595 |
| 6,015,997 | * 1/2000 | Hu et al. | 257/314 |

FOREIGN PATENT DOCUMENTS

| | | | |
|---|---|---|---|
| 405075109 | * 3/1993 | (JP) | 257/412 |
| 406232401 | * 3/1993 | (JP) | 257/412 |
| 406151834 | * 5/1994 | (JP) | 257/412 |
| 6-333923 | 12/1994 | (JP) | . |
| 9-121038 | 5/1997 | (JP) | . |

* cited by examiner

Primary Examiner—David Hardy
Assistant Examiner—Elgardo Ortiz
(74) Attorney, Agent, or Firm—McDermott, Will & Emery

(57) ABSTRACT

A semiconductor device having a conductive layer of small conductive resistance and including only a small step is provided. The semiconductor device comprises a first source line extending in one direction and a silicon oxide film having a contact trench reaching the first source line. The contact trench extends in one direction along the first source line. The semiconductor device further comprises a second source line which is formed in the contact trench. A part of the second source line exposes a partial surface of the first source line to be in contact with this partial surface of the first source line.

9 Claims, 20 Drawing Sheets

SEMICONDUCTOR DEVICE WITH A CONDUCTIVE LAYER OF SMALL CONDUCTIVE RESISTANCE

BACKGROUND OF THE INVENTION

1. Field of the Invention

The present invention relates to a semiconductor device, and more particularly, it relates to a semiconductor device having a conductive layer of small conductive resistance.

2. Description of the Prior Art

Among semiconductor devices, nonvolatile semiconductor memory devices losing no data in power-off states are widely employed in general. An EEPROM (electrically erasable and programmable read only memory) which can freely program data and is capable of electrically writing and erasing information is known as one of such nonvolatile semiconductor memory devices.

In relation to such an EEPROM, known is a flash memory having memory cells each formed by a single transistor, which can electrically batch-erase information charges written therein.

FIG. 34 is a sectional view showing a conventional flash memory. Referring to FIG. 34, a source region 113 and drain regions 102 are formed on a surface of a silicon substrate 101 at distances from each other. Floating gate electrodes 104 are formed on the silicon substrate 101 through gate oxide films 103. Control gate electrodes 106 consisting of doped polysilicon layers 106a and tungsten silicide layers 106b are formed on the floating gate electrodes 104 through interlayer isolation films 105. Side wall oxide films 107 are formed on side walls of the control gate electrodes 106 and the floating gate electrodes 104. A silicon oxide film 115 is formed on the silicon substrate 101, to cover the control gate electrodes 106.

When gate electrodes are refined, conductive resistance thereof is disadvantageously increased in general. Known is a method of preventing this problem by forming wiring layers on the gate electrodes and connecting the former with the latter thereby reducing conductive resistance.

FIG. 35 is a sectional view showing wiring layers 294 formed on conventional gate electrodes 292. Referring to FIG. 35, the gate electrodes 292 consisting of doped polysilicon layers 292a and tungsten silicide layers 292b are formed on a silicon substrate 201 through gate oxide films 291. A silicon oxide film 293 is formed to cover the gate electrodes 292. The wiring layers 294 of aluminum are formed on the silicon oxide film 293 in a width substantially identical to that of the gate electrode 292. The wiring layers 294 are electrically connected with the gate electrodes 292 respectively.

In this structure, the sectional areas of conductive layers are not reduced following refinement of the gate electrodes 292, due to the presence of the wiring layers 294. Consequently, increase of the conductive resistance can be prevented.

When the conventional flash memory shown in FIG. 34 is further refined, the sectional area of the source region 113 is reduced. Thus, the conductive resistance of the source region 113 is increased, to retard the operating speed of the flash memory. Further, a leakage current is readily generated. In order to solve this problem, a wiring layer of aluminum or the like may be formed on the silicon oxide film 115, to be electrically connected with the source region 113. In this method, however, the wiring layer formed on the silicon oxide film 115 causes a step, to result in a problem such as difference in depth of focus in a subsequent photolithographic step, for example.

When the conventional semiconductor device shown in FIG. 35 is further refined, on the other hand, the sectional areas of the wiring layers 294 are reduced to increase the conductive resistance. The wiring layers 294 may be increased in height, in order to increase the sectional areas. In this case, however, it is so difficult to pattern the wiring layers 294 in prescribed shapes that adjacent ones of the wiring layers 294 readily come into contact with each other. Consequently, the yield of the semiconductor device is disadvantageously reduced.

SUMMARY OF THE INVENTION

The present invention has been proposed in order to solve the aforementioned problems, and an object thereof is to provide a semiconductor device having a conductive layer of small conductive resistance and including only a small step.

Another object of the present invention is to provide a semiconductor device having a fine wiring layer of small conductive resistance.

A semiconductor device according to an aspect of the present invention comprises a semiconductor substrate, a first conductive layer and an interlayer isolation film. The semiconductor substrate has a major surface. The first conductive layer is formed on a portion of the major surface of the semiconductor substrate to extend in one direction. The interlayer isolation film is formed on the major surface of the semiconductor substrate, and has a trench reaching the first conductive layer. The trench is defined by opposite side walls of the interlayer isolation film, and extends in one direction along the conductive layer. The semiconductor device further comprises a second conductive layer which is formed on opposite side walls of the trench. A part of the second conductive layer is in contact with a partial surface of the first conductive layer while exposing another partial surface of the first conductive layer.

In the semiconductor device having the aforementioned structure, the second conductive layer is in contact with the first conductive layer, thereby increasing the sectional areas of the conductive layers. Thus, a semiconductor device having small conductive resistance can be provided. Further, the second conductive layer is formed on the side walls of the trench, not to project upward beyond the interlayer isolation film. Thus, a semiconductor device having only a small step can be provided. In addition, the first conductive layer is partially exposed, to include a part which is not in contact with the second conductive layer in its surface. When the first conductive layer is formed by an impurity region, therefore, the second conductive layer hardly absorbs the impurity contained in the first conductive layer. Consequently, the first conductive layer can be suppressed from increase of conductive resistance, thereby preventing generation of a leakage current.

The semiconductor device preferably further comprises an electrode layer which is formed on the major surface of the semiconductor substrate to extend along the first conductive layer.

Further, it is preferable that the semiconductor substrate has a concave part communicating with the trench, the concave part is defined by a side wall of the first conductive layer, and the second conductive layer is formed on the side walls of the trench and the concave part to be in contact with the first conductive layer. In this case, the sectional area of the second conductive layer is increased due to the formation on the side wall of the concave part. Thus, the resistance of the conductive layers is further reduced.

Further, it is preferable that the first and second conductive layers are source lines.

A semiconductor device according to another aspect of the present invention comprises a semiconductor substrate, an electrode layer, a first conductive layer, a side wall insulator film, and a second conductive layer. The semiconductor substrate has a major surface. The electrode layer is formed on the major surface of the semiconductor substrate to extend in one direction, and has a side wall. The first conductive layer is formed on a portion of the major surface of the semiconductor substrate to extend along the electrode layer. The side wall insulator film is formed on the side wall of the electrode layer. The second conductive layer is formed on the side wall insulator film. A part of the second conductive layer is in contact with a partial surface of the first conductive layer while exposing another partial surface of the first conductive layer.

In the semiconductor device having the aforementioned structure, the second conductive layer is in contact with the first conductive layer, thereby increasing the sectional areas of the conductive layers. Therefore, a semiconductor device having small conductive resistance can be provided. Further, the second conductive layer is formed on the side wall insulator film. Therefore, a semiconductor device having the second conductive layer not projecting upward and including only a small step can be provided. In addition, the partial surface of the first conductive layer is exposed, so that the first conductive layer includes a part which is not in contact with the second conductive layer in its surface. When the first conductive layer is formed by an impurity region, therefore, the second conductive layer hardly absorbs the impurity contained in the first conductive layer. Consequently, the first conductive layer can be suppressed from increase of conductive resistance, whereby a semiconductor device having only a small leakage current can be provided.

The semiconductor device preferably further comprises a protective insulator film which is formed between the second conductive layer and the side wall insulator film. In this case, the side wall insulator film and the protective insulator film are present between the second conductive layer and the electrode layer, so that the second conductive layer hardly comes into contact with the electrode layer. Consequently, the yield of the semiconductor device can be improved.

Further, it is preferable that the first and second conductive layers are source lines.

A semiconductor device according to still another aspect of the present invention comprises a semiconductor substrate, a first conductive layer, an insulator film, and a second conductive layer. The semiconductor substrate has a major surface. The first conductive layer is formed on the major surface of the semiconductor substrate to extend in one direction. The insulator film has a projecting part which is formed along the longitudinal direction of the first conductive layer, and covers the first conductive layer. The second conductive layer is formed on the insulator film along the longitudinal direction of the first conductive layer. The projecting part of the insulator film is formed by a lower surface, a top surface projecting from the lower surface, and side surfaces connecting the top surface with the lower surface in opposition to each other. The distance between the opposite side surfaces increases from the lower surface toward the top surface. The second conductive layer is formed along upper portions of the side surfaces.

In the semiconductor device having the aforementioned structure, the distance between the side surfaces of the projecting part increases toward the top surface. Thus, the projecting part can be regarded as having an inversely tapered shape. The second conductive layer, which is formed along the upper portions of the side surfaces defining the inversely tapered shape, can be formed with a larger sectional area. Consequently, a semiconductor device having a wiring layer of small conductive resistance can be provided.

Further, it is preferable that the second conductive layer includes tungsten.

A method of fabricating a semiconductor device according to a further aspect of the present invention comprises steps of:

(1) forming a first conductive layer on a major surface of a semiconductor substrate to extend in one direction;

(2) forming an insulator film covering the first conductive layer;

(3) forming a mask having a prescribed pattern on the insulator film;

(4) anisotropically etching the insulator film along the pattern formed on the mask, thereby forming a convex part on the insulator film;

(5) isotropically etching the insulator film while leaving the mask after forming the convex part, thereby forming a projecting part which is formed by a lower surface, a top surface projecting from the lower surface and side surfaces connecting the top surface with the lower surface in opposition to each other so that the distance between the opposite side surfaces increases from the lower surface toward the top surface;

(6) forming a conductive layer to cover the projecting part; and (7) etching back the conductive layer overall, thereby forming a second conductive layer along upper portions of the side surfaces of the projecting part.

In the method of fabricating a semiconductor device comprising such steps, the projecting part is formed by etching the insulator film along the pattern, and the second conductive layer is formed by etching back the conductive layer formed on the projecting part overall. Therefore, a fine second conductive layer can be formed as compared with the case of forming a resist pattern on a conductive layer and patterning the conductive layer along the resist pattern. Further, the conductive layer remains around the lower surface of the projecting part in the etch-back step, to increase the sectional area. Thus, a wiring layer having small conductive resistance can be readily formed.

A method of fabricating a semiconductor device according to a further aspect of the present invention comprises steps of:

(1) forming a first conductive layer on a major surface of a semiconductor substrate to extend in one direction;

(2) forming a first insulator film, which is relatively easy to isotropically etch, to cover the first conductive layer;

(3) forming a second insulator film, which is relatively hard to isotropically etch, on the first insulator film;

(4) forming a mask having a prescribed pattern on the second insulator film;

(5) isotropically etching the first and second insulator films along the pattern formed on the mask, thereby forming a projecting part which is formed by a lower surface, a top surface projecting from the lower surface and side surfaces connecting the top surface with the lower surface in opposition to each other so that the distance between the opposite side surfaces increases from the lower surface toward the top surface;

(6) forming a conductive layer to cover the projecting part; and (7) etching back the conductive layer overall, thereby forming a second conductive layer along upper portions of the side surfaces of the projecting part.

In the method of fabricating a semiconductor device comprising such steps, the projecting part is formed by etching the first and second insulator films along the pattern and the second conductive layer is formed by etching back the conductive layer which is formed on the projecting part overall. Therefore, a semiconductor device having a fine second conductive layer can be formed as compared with the case of forming a resist pattern on a conductive layer and patterning the conductive layer along the resist pattern. Further, the conductive layer remains around the lower surface of the projecting part in the etch-back step, to increase the sectional area. Thus, a wiring layer having small conductive resistance can be readily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
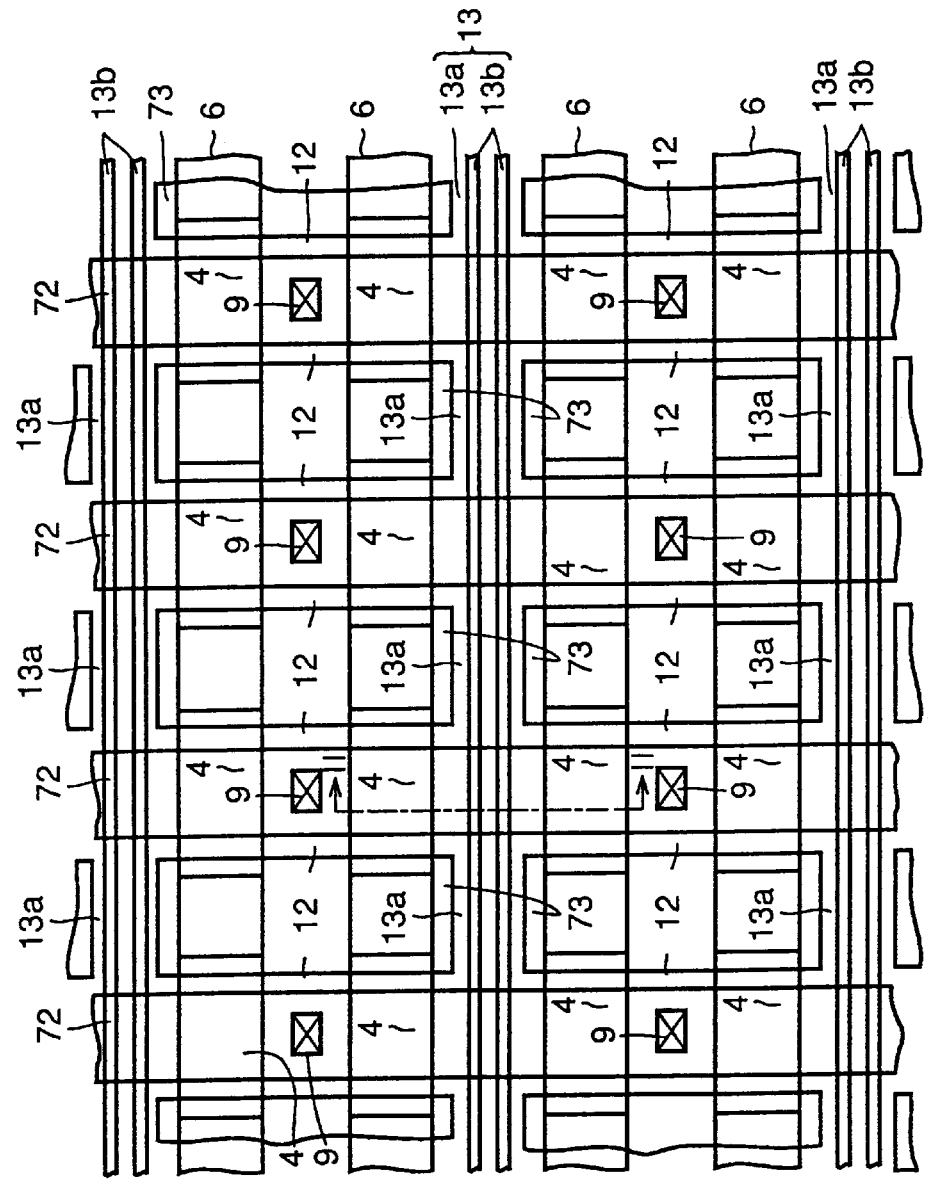
FIG. 1 is a plan view of a flash memory according to an embodiment 1 of the present invention.

Referring to FIG. 1 showing a flash memory according to an embodiment 1 of the present invention, isolation oxide films 73 are formed on a surface of a silicon substrate 1 in the form of islands. First source lines 13a serving as first conductive layers extending in one direction in the silicon substrate 1 are formed between the isolation oxide films 73. Second source lines 13b serving as second conductive layers are formed to be in contact with the first source lines 13a. The first and second source lines 13a and 13b form source regions 13.

Drain regions 12 are formed on positions separating from the source regions 13. Floating gate electrodes 4 are formed between the source regions 13 and the drain regions 12. Control gate electrodes 6 serving as electrode layers extending along the first and second source lines 13a and 13b are formed on the floating gate electrodes 4. Bit lines 72 are formed to extend perpendicularly to the control gate electrodes 6. These bit lines 72 are electrically connected with the drain regions 12 through contact holes 9.

Figure 2:
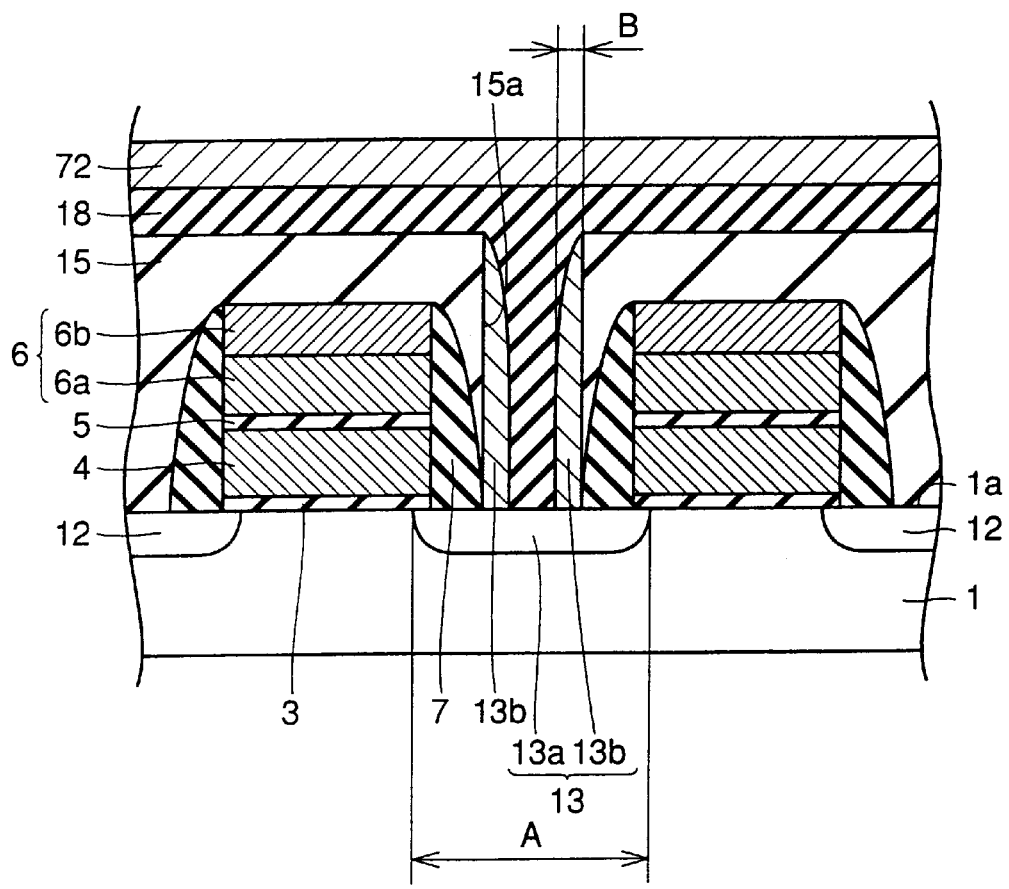
FIG. 2 is a sectional view taken along the line II—II in FIG. 1.

Referring to FIG. 2, the floating gate electrodes 4 of about 1000 Å in thickness are formed on a major surface 1a of the p-type silicon substrate 1 through gate oxide films 3 of about 130 Å in thickness. ONO films 5 prepared by stacking silicon oxide films, silicon nitride films and silicon oxide films with each other are formed on the floating gates 4. The control gate electrodes 6 consisting of doped polysilicon layers 6a and tungsten silicide layers 6b are formed on the ONO films 5.

The width of the floating gate electrodes 4 and the control gate electrodes 6, i.e., the gate length is about 0.9 $\mu$m. Side wall oxide films 7 are formed on side walls of the control gate electrodes 6 and the floating gate electrodes 4. A silicon oxide film 15 serving as an interlayer isolation film is formed to cover the control gate electrodes 6. A contact trench 15a is formed in the silicon oxide film 15.

A first source line 13a consisting of an n-type diffusion layer and a pair of second source lines 13b, consisting of aluminum, which are in contact with the first source line 13a are formed between the two floating gate electrodes 4. The width A of the first source line 13a is about 0.8 $\mu$m, and the width B of the second source lines 13b is 0.1 $\mu$m or more but not exceeding 0.2 $\mu$m. The inner diameter of the contact trench 15a is about 0.5 $\mu$m. Drain regions 12 are formed on positions separating from the first source line 13a. The distance between the first source line 13a and each drain region 12 is about 0.8 $\mu$m. A buried oxide film 18 is formed to fill up the contact trench 15a. The bit line 72 is formed on the buried oxide film 18.

Such a flash memory is provided with not only the first source line 13a consisting of a diffusion layer but also the second source lines 13b consisting of aluminum, whereby the source region 13 can be suppressed from increase of its conductive resistance. Further, the second source lines 13b are formed in the contact trench 15a, to form no step on the silicon oxide film 15. Therefore, a later step hardly results in a problem caused by difference in depth of focus. In addition, a surface of the first source line 13a is partially exposed to be in contact with the buried oxide film 18. Therefore, the second source lines 13b hardly absorb the impurity contained in the first source line 13a, as compared with such case that the pair of second source lines 13b are connected with each other to cover the first source line 13a. Thus, the first source line 13a can be suppressed from increase of its conductive resistance, thereby preventing generation of a leakage current.

Figure 3:
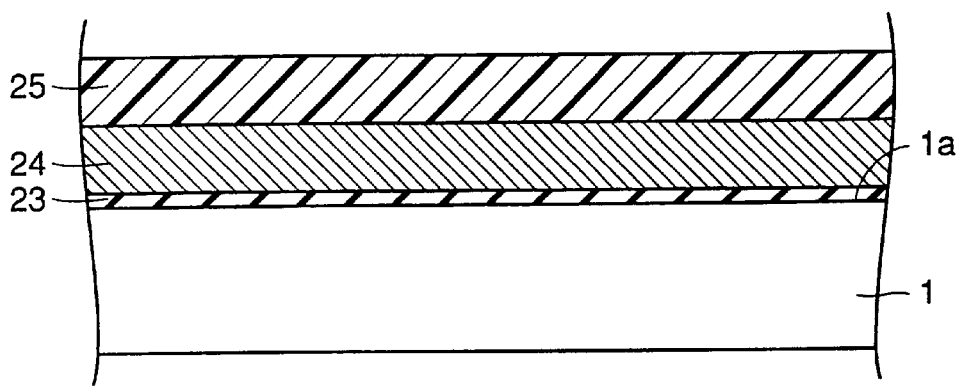
FIGS. 3 to 8 are sectional views showing first to sixth steps of a method of fabricating the flash memory shown in FIG. 2.

A method of fabricating the flash memory shown in FIG. 2 is now described. Referring to FIG. 3, a thermal oxide film is formed on the silicon substrate 1 by thermal oxidation. Doped polysilicon is deposited on the thermal oxide film by CVD (chemical vapor deposition). A resist pattern 25 is formed on this doped polysilicon. The doped polysilicon and the thermal oxide film are etched along this resist pattern 25, thereby forming a strip-shaped doped polysilicon layer 24 and a strip-shaped oxide film 23.

Figure 4:
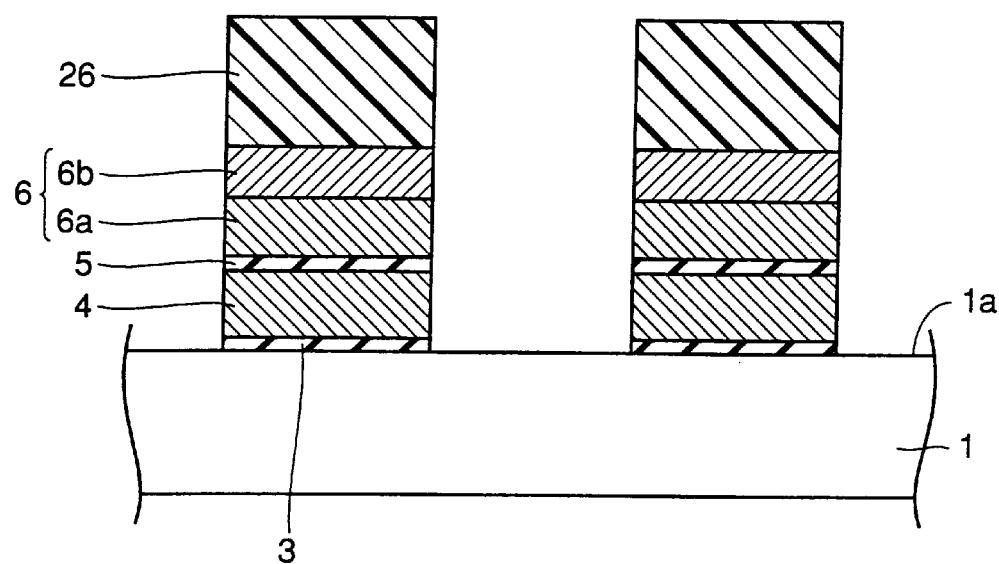

Referring to FIG. 4, a silicon oxide film, a silicon nitride film and another silicon oxide film are formed on the strip-shaped doped polysilicon layer 24 by CVD. Doped polysilicon is deposited on the silicon oxide film by CVD. Tungsten silicide is deposited on the doped polysilicon by sputtering. A resist pattern 26 is formed on the tungsten silicide for etching the portion from the tungsten silicide up to the strip-shaped oxide film 23 along this resist pattern 26, thereby forming the tungsten silicide layers 6b, the doped polysilicon layers 6a, the ONO films 5, the floating gate electrodes 4 and the gate oxide films 3.

Figure 5:
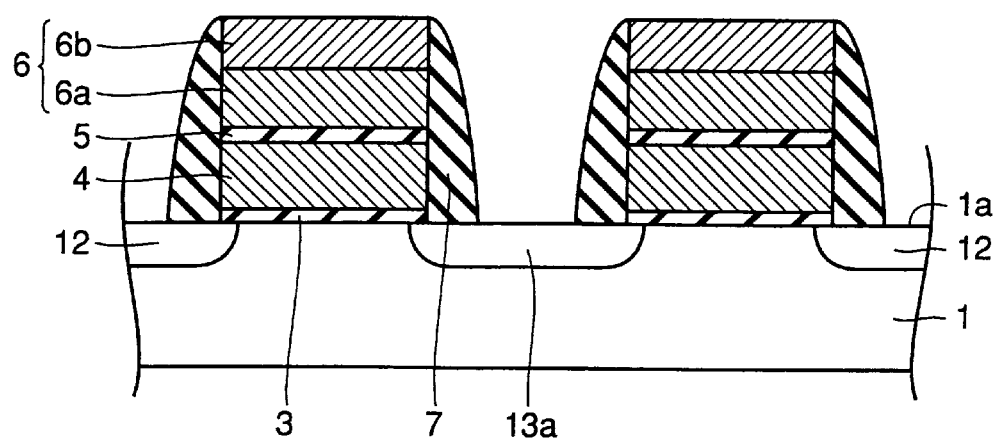

Referring to FIG. 5, an n-type impurity such as phosphorus is injected into the silicon substrate 1, thereby forming the first source line 13a and the drain regions 12. A silicon oxide film is deposited on the silicon substrate 1 by CVD, to cover the tungsten silicide layers 6b. This silicon oxide film is etched back overall, thereby forming the side wall oxide films 7 to be in contact with the side walls of the floating gate electrodes 4 and the control gate electrodes 6.

Figure 6:
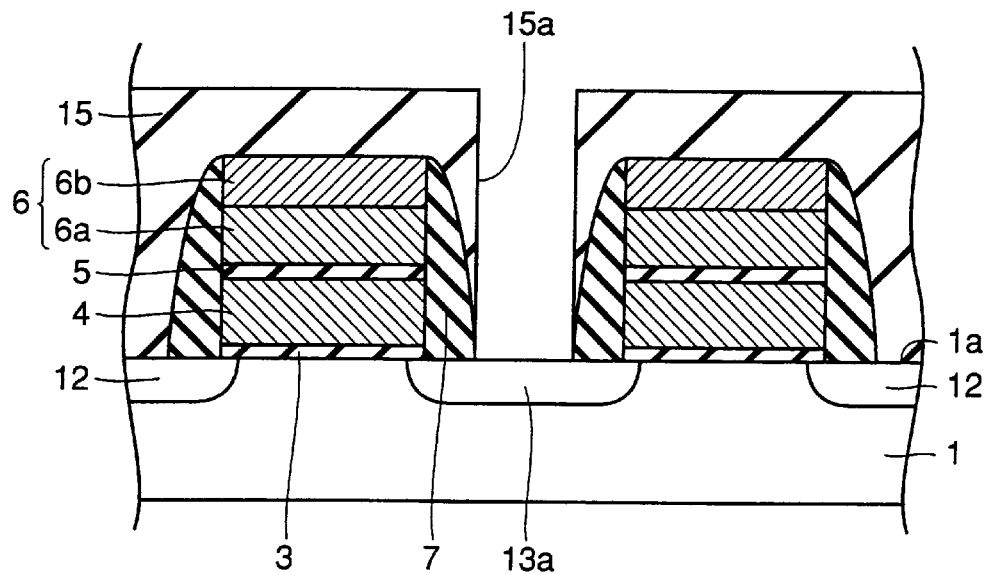

Referring to FIG. 6, the silicon oxide film 15 serving as an interlayer isolation film is deposited by CVD, to cover the control gate electrodes 6. A resist pattern is formed on the silicon oxide film 15 for etching the silicon oxide film 15 along this resist pattern, thereby forming the contact trench 15a reaching the first source line 13a.

Figure 7:
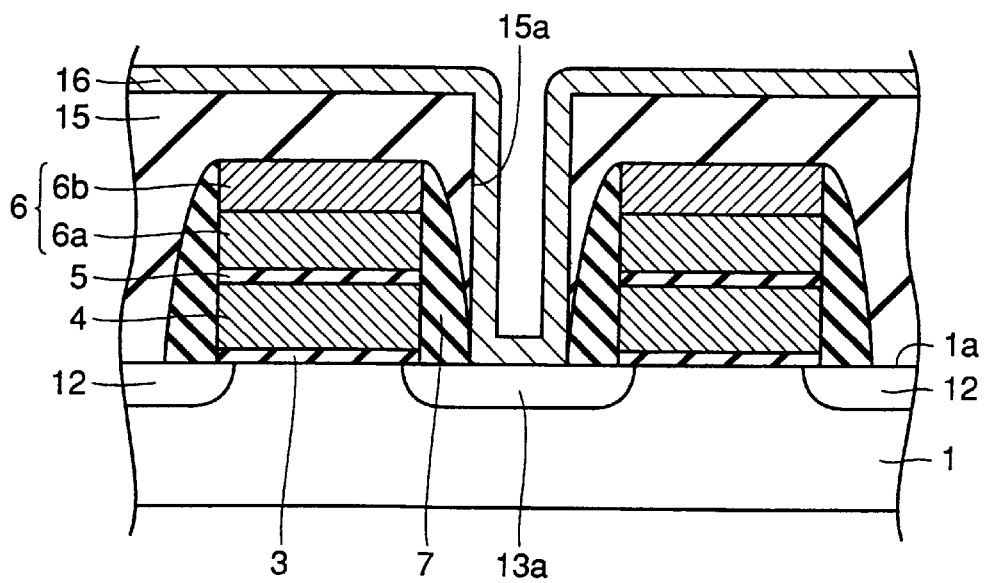

Referring to FIG. 7, an aluminum layer 16 of about 0.2 μm in thickness is deposited by sputtering, to cover the surface of the silicon substrate 1 and the contact trench 15a.

Figure 8:
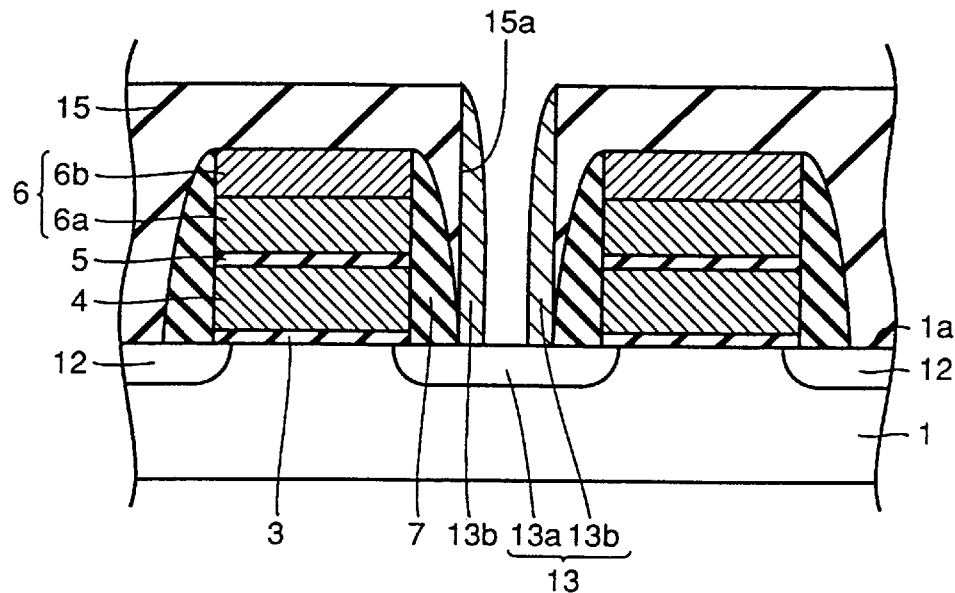

Referring to FIG. 8, the aluminum layer 16 is etched back overall, thereby forming the second source lines 13b which are in contact with side walls of the contact trench 15a and the first source line 13a.

Referring again to FIG. 2, the buried oxide film 18 consisting of a silicon oxide film is formed by CVD, to fill up the contact trench 15a. Aluminum is deposited on the buried oxide film 18 by sputtering, and patterned into a prescribed shape, thereby forming the bit line 72. Thus, the flash memory shown in FIG. 2 is completed.

The flash memory shown in FIG. 2 can be reliably fabricated along the aforementioned steps.

Embodiment 2

Figure 9:
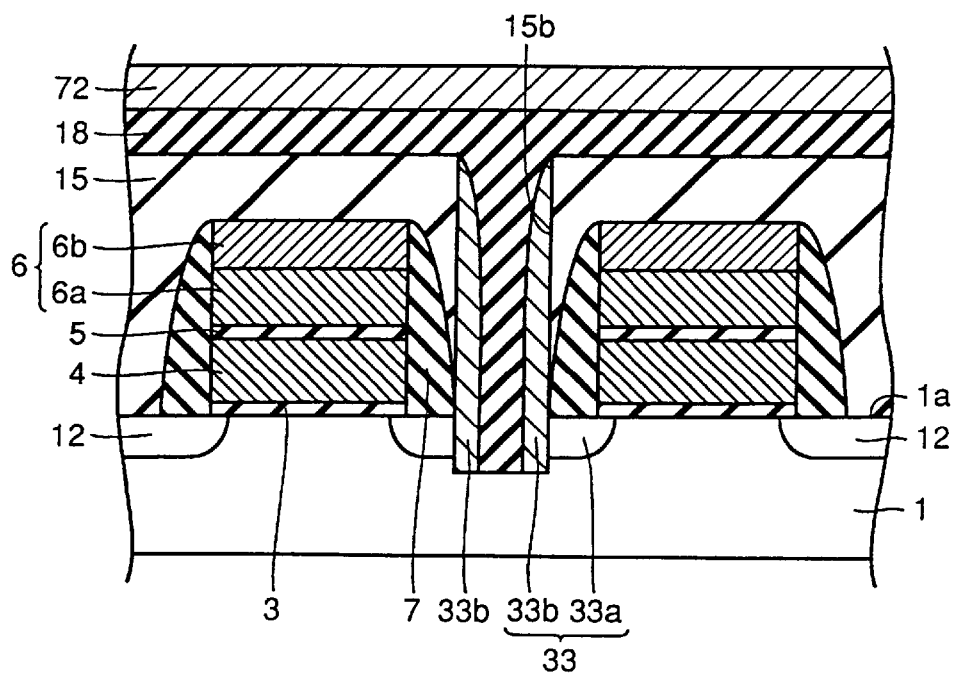
FIG. 9 is a sectional view of a flash memory according to an embodiment 2 of the present invention.

Referring to FIG. 9 showing a flash memory according to an embodiment 2 of the present invention, a contact trench 15b reaches a bottom portion of a first source region 33a, to divide the first source region 33a. Second source lines 33b are formed to be in contact with the contact trench 15b and the first source line 33a. As to the remaining points, the flash memory shown in FIG. 9 is similar in structure to that shown in FIG. 2.

A plan view of the flash memory shown in FIG. 9 is identical to that shown in FIG. 1, and hence redundant description is omitted.

The flash memory having the aforementioned structure attains an effect similar to that of the flash memory according to the embodiment 1 of the present invention. Further, the contact trench 15b deepens, to increase the sectional areas of the second source lines 33b. Consequently, conductive resistance of a source region 33 is further effectively reduced. Further, different potentials can be applied to the divided parts of the first source line 33a respectively. If side wall oxide films 7 are reduced in thickness, leakage currents may be generated between the second source lines 33b and control gate electrodes 6. In this case, the second source lines 33b are preferably provided only on portions to be in contact with the first source line 33a.

Figure 10:
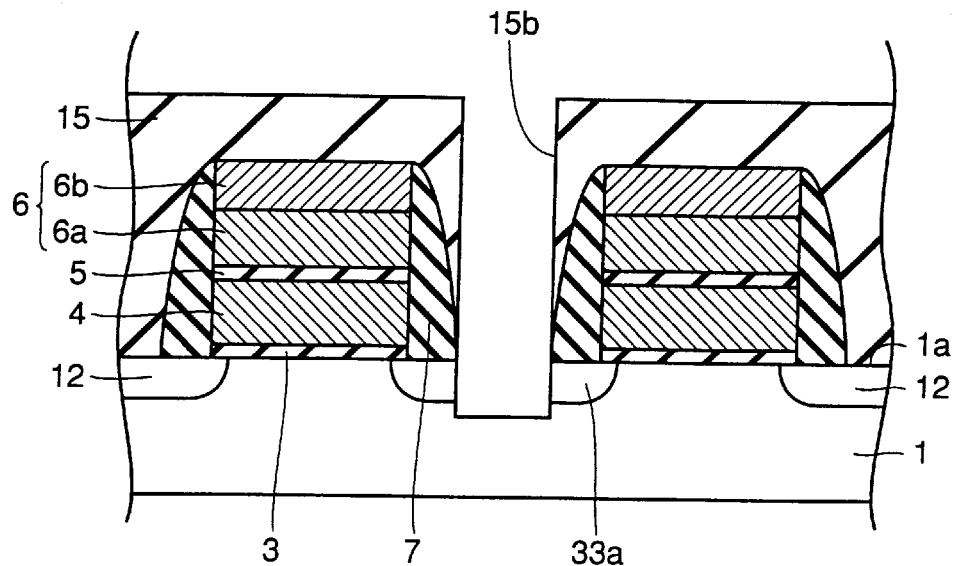
FIGS. 10 to 12 are sectional views showing first to third steps of a method of fabricating the flash memory shown in FIG. 9.

Referring to FIG. 10, silicon oxide films 3, floating gate electrodes 4, ONO films 5, the control gate electrodes 6, the side wall oxide films 7, the first source line 33a, drain regions 12 and a silicon oxide film 15 are formed on a silicon substrate 1 through steps similar to those of the embodiment 1 shown in FIGS. 3 to 5. A resist pattern is formed on the silicon oxide film 15 for etching the silicon oxide film 15 and the silicon substrate 1 along this resist pattern, thereby forming the contact trench 15b.

Figure 11:
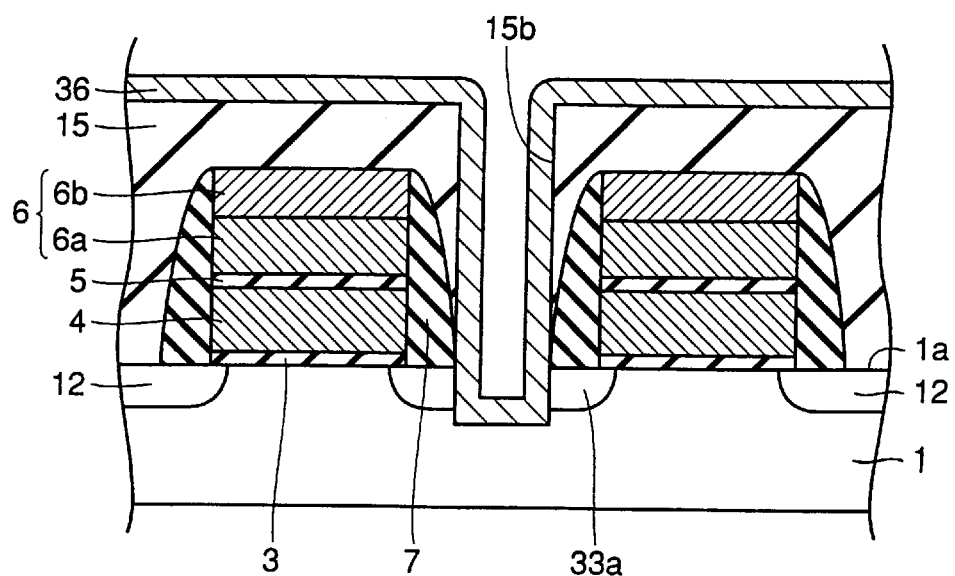

Referring to FIG. 11, an aluminum layer 36 is deposited by sputtering, to cover a surface of the silicon oxide film 15 and the contact trench 15b.

Figure 12:
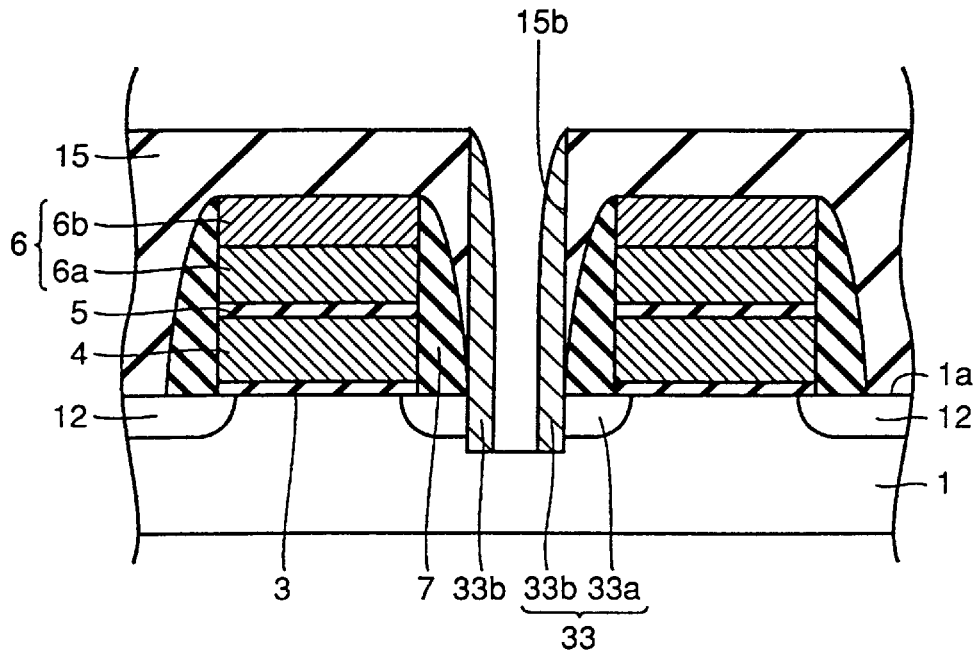

Referring to FIG. 12, the aluminum layer 36 is etched back overall, thereby forming the second source lines 33b which are in contact with the first source line 33a. The first and second source lines 33b form the source region 33.

Referring again to FIG. 9, a buried oxide film 18 is formed to cover the contact trench 15b and a bit line 72 is formed on the buried oxide film 18, thereby completing the flash memory. According to such steps, a flash memory having source lines of small conductive resistance and including only a small step can be reliably fabricated.

Embodiment 3

Figure 13:
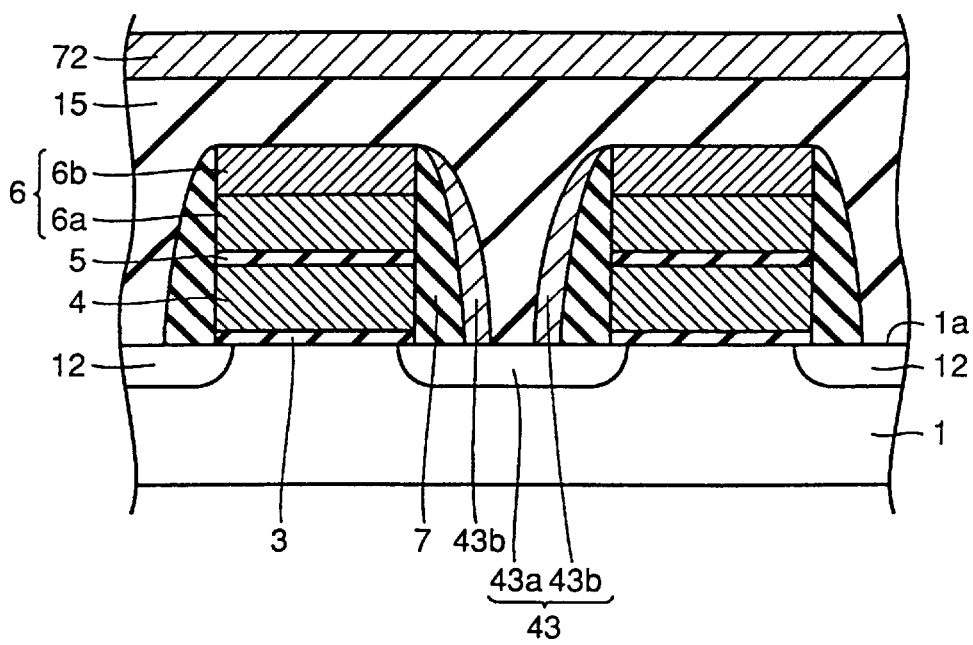
FIG. 13 is a sectional view of a flash memory according to an embodiment 3 of the present invention.

Referring to FIG. 13 showing a flash memory according to an embodiment 3 of the present invention, second source lines 43b are formed to be in contact with side wall oxide films 7 and a first source line 43a, but not with tungsten silicide layers 6b. This flash memory is provided with no buried oxide film. As to the remaining points, the flash memory shown in FIG. 13 is similar to that shown in FIG. 2, and hence redundant description is omitted. A plan view of the flash memory shown in FIG. 13 is similar to that shown in FIG. 1, except that the first source line 43a has a larger width than the first source lines 13a shown in FIG. 1.

This flash memory attains an effect similar to that of the flash memory according to the embodiment 1 of the present invention.

Figure 14:
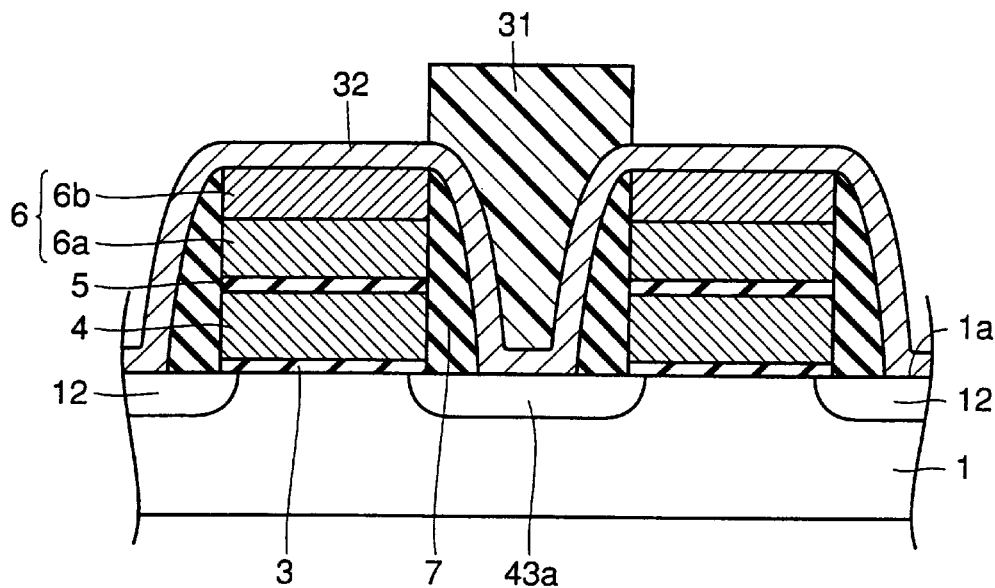
FIGS. 14 to 16 are sectional views showing first to third steps of a method of fabricating the flash memory shown in FIG. 13.

A method of fabricating the flash memory shown in FIG. 13 is now described. First, gate oxide films 3, floating gate electrodes 4, ONO films 5, control gate electrodes 6, the first source line 43a and the side wall oxide films 7 are formed through steps similar to those of the embodiment 1 shown in FIGS. 3 to 5. Referring to FIG. 14, an aluminum layer 32 is deposited by sputtering, to cover the control gate electrodes 6. A resist pattern 31 is formed on the aluminum layer 32.

Figure 15:
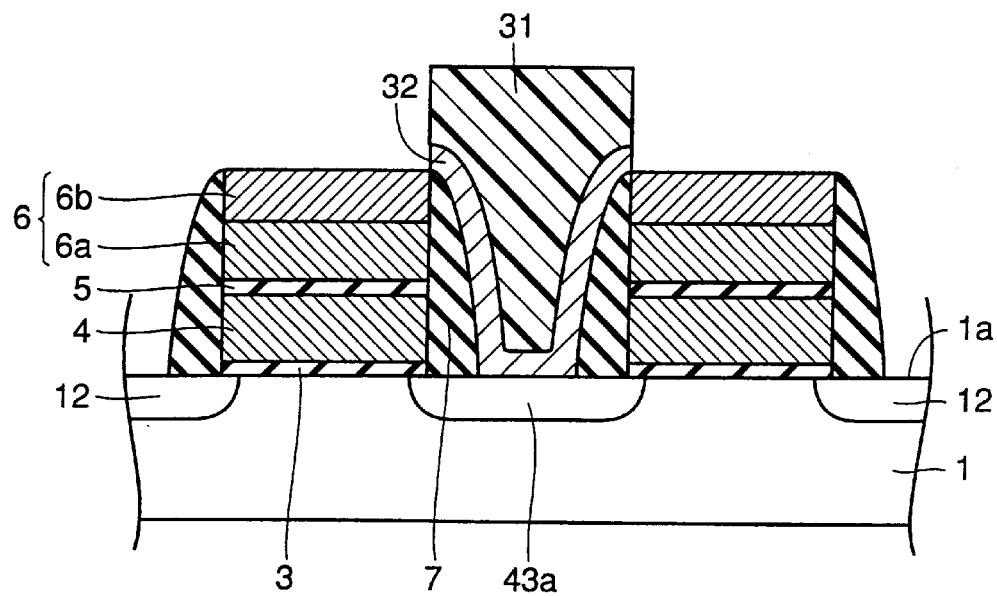

Referring to FIG. 15, the aluminum layer 32 is etched along the resist pattern 31. At this time, the aluminum layer 32 is etched not to be in contact with the tungsten silicide layers 6b.

Figure 16:
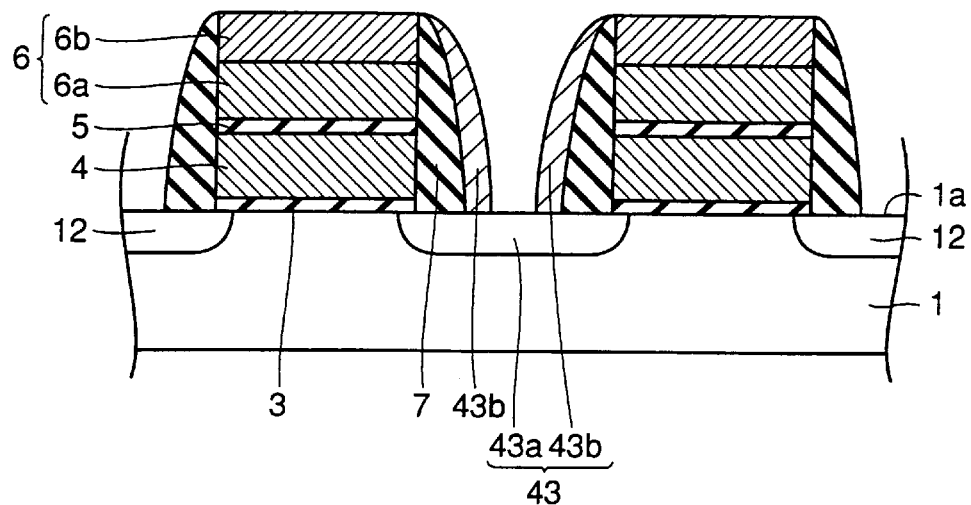

Referring to FIG. 16, the resist pattern 31 is removed and thereafter the aluminum layer 32 is etched back overall. Thus, the second source lines 43b are formed to be in contact with the side wall oxide films 7 and the first source line 43a but not with the tungsten silicide layers 6b. The first and second source lines 43a and 43b form a source region 43.

The flash memory shown in FIG. 13 can be reliably fabricated in accordance with the aforementioned method.

Embodiment 4

Figure 17:
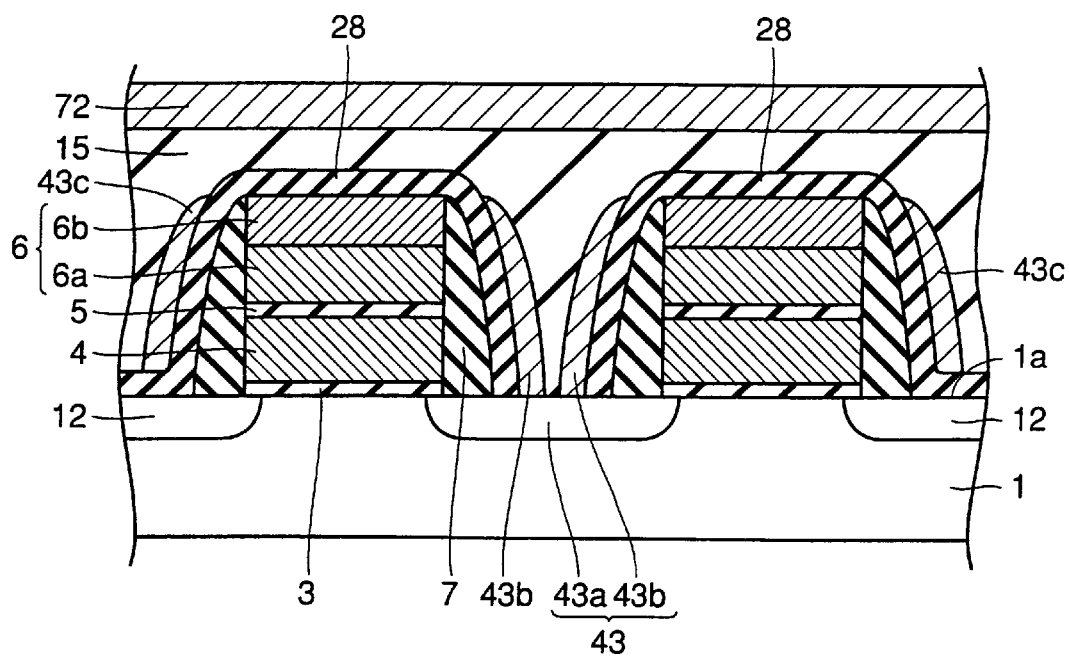
FIG. 17 is a sectional view of a flash memory according to an embodiment 4 of the present invention.

In a flash memory according to an embodiment 4 of the present invention shown in FIG. 17, a protective insulator film 28 is formed between second source lines 43b and side wall oxide films 7. Further, conductive layers 43c are formed on drain regions 12. As to the remaining points, the flash memory shown in FIG. 17 is similar to that shown in FIG. 13, and hence redundant description is omitted.

The flash memory having the aforementioned structure attains an effect similar to that of the flash memory according to the embodiment 1. Further, the tungsten silicide layers 6b hardly come into contact with the second source lines 43b due to the protective insulator film 28, whereby the yield of the flash memory is effectively improved.

Figure 18:
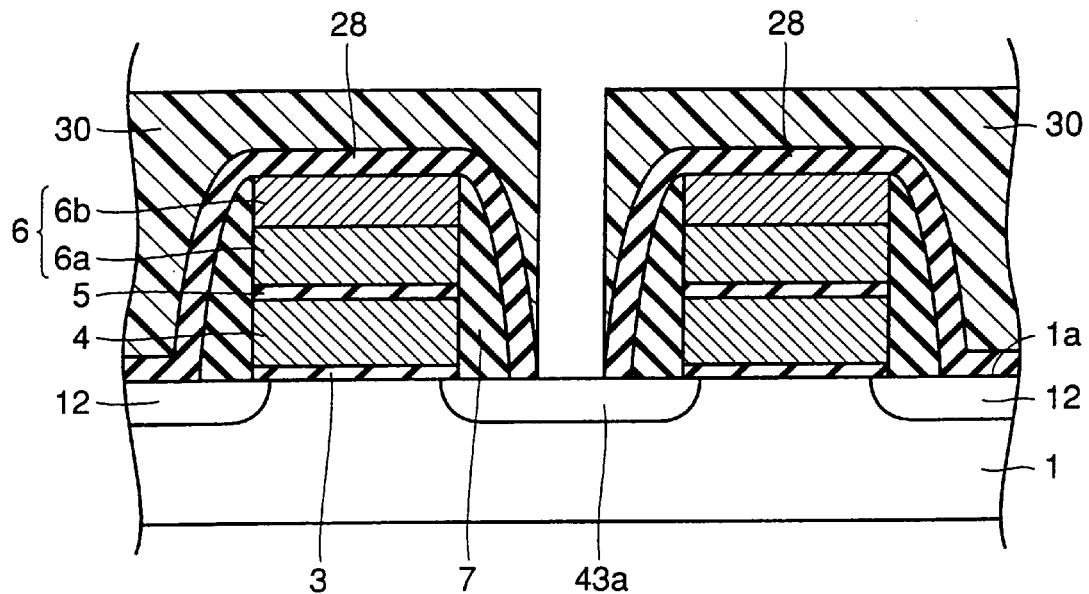
FIGS. 18 to 20 are sectional views showing first to third steps of a method of fabricating the flash memory shown in FIG. 17.

A method of fabricating the flash memory shown in FIG. 17 is now described. First, gate oxide films 3, floating gate electrodes 4, ONO films 5, control gate electrodes 6, the side wall oxide films 7, a first source line 43a and the drain regions 12 are formed through steps similar to those of the embodiment 1 shown in FIGS. 3 to 5. Referring to FIG. 18, the protective insulator film 28 consisting of a silicon oxide film is formed by CVD to cover the control gate electrodes 6. A resist pattern 30 is formed on the protective insulator film 28. The protective insulator film 28 is etched along the resist pattern 30, thereby partially exposing the first source line 43a.

Figure 19:
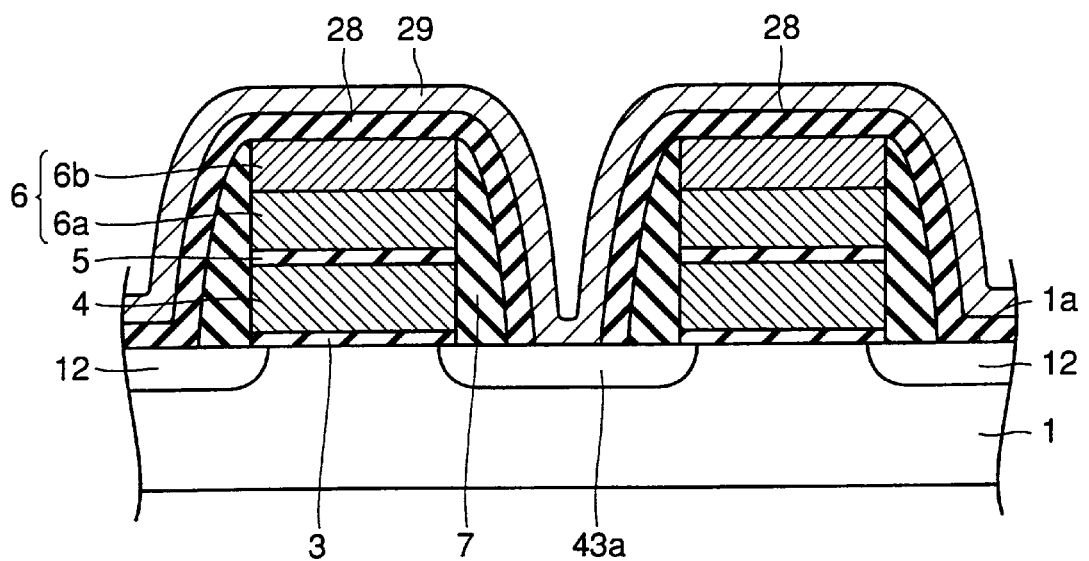

Referring to FIG. 19, an aluminum layer 29 is formed by sputtering, to cover the protective insulator film 28 and the exposed part of the first source line 43a.

Figure 20:
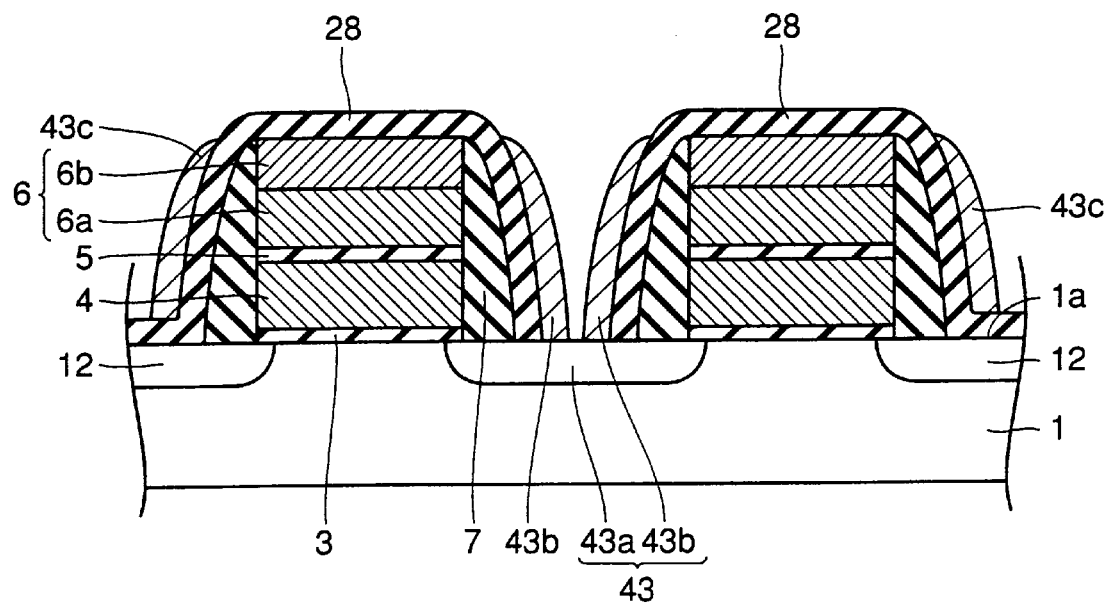

Referring to FIG. 20, the aluminum layer 29 is etched back overall, thereby forming the second source lines 43b which are in contact with the first source line 43a and the protective insulator film 28. The first and second source lines 43a and 43b form a source region 43. Conductive layers 43c are formed on the drain regions 12.

According to these fabrication steps, the flash memory shown in FIG. 17 can be reliably fabricated. Further, the conductive layers 43c can be employed as other wires.

Embodiment 5

Figure 21:
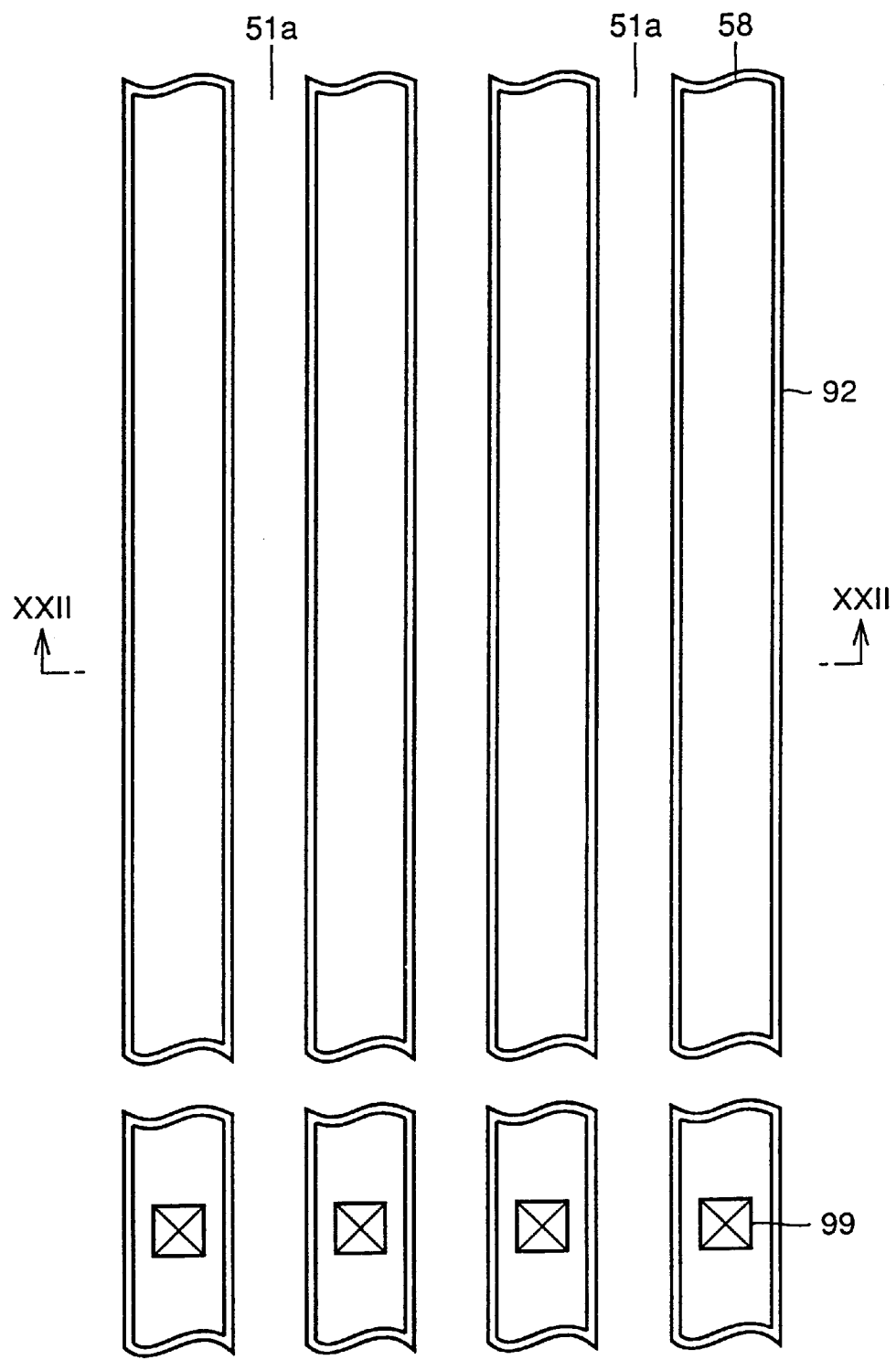
FIG. 21 is a plan view of a semiconductor device according to an embodiment 5 of the present invention.

Referring to FIG. 21 showing a semiconductor device according to an embodiment 5 of the present invention, a plurality of gate electrodes 92 serving as first conductive layers are formed on a silicon substrate to extend in one direction. Wiring layers 58 serving as second conductive layers, which are substantially similar in width to the gate electrodes 92, are formed to extend in the same direction as the gate electrodes 92. The wiring layers 58 are electrically connected with the gate electrodes 92 through contact holes 99. Projecting parts 51a of a silicon oxide film are formed between the first and second wiring layers 58 provided on the right side and between those provided on the left side respectively.

Figure 22:
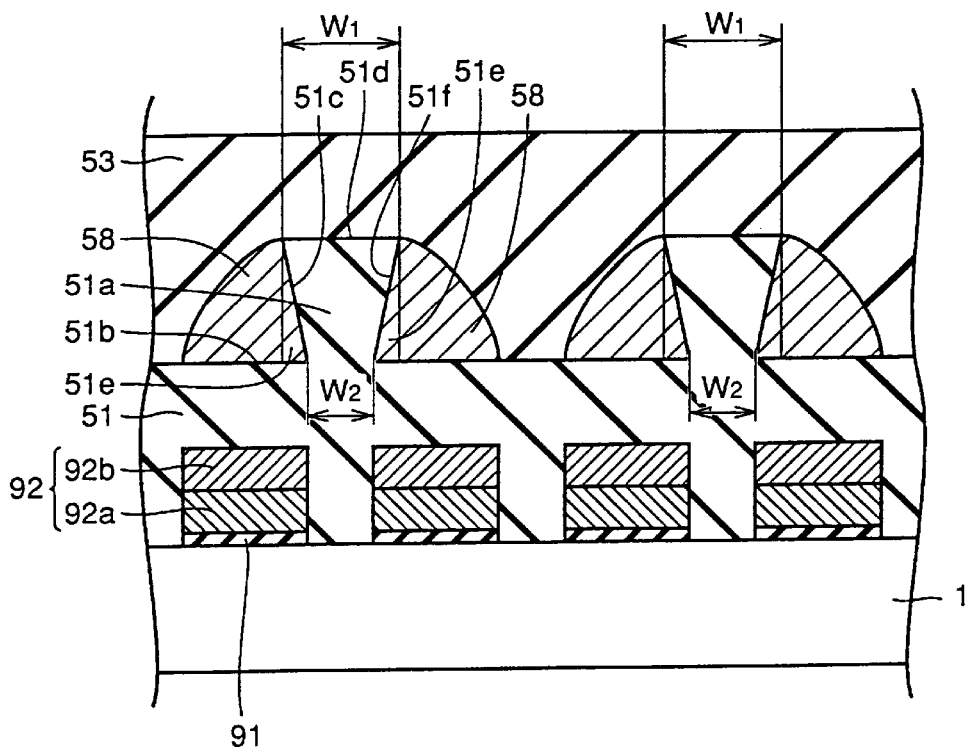
FIG. 22 is a sectional view taken along the line XXII—XXII in FIG. 21.

Referring to FIG. 22, the gate electrodes 92 are formed on a silicon substrate 1 through gate oxide films 91. The gate electrodes 92 consist of doped polysilicon layers 92a and tungsten silicide layers 92b. A silicon oxide film 51 serving as an insulator film is formed on the silicon substrate 1 to cover the gate electrodes 92. This silicon oxide film 51 is provided with the projecting parts 51a. The projecting parts 51a are formed by bottom surfaces 51b, top surfaces 51d and side surfaces 51c and 51f. The distances between the opposite side surfaces 51c and 51f increase from the bottom surfaces 51b toward the top surfaces 51d. Therefore, the projecting parts 51a have inversely tapered shapes. The projecting parts 51a have the largest and narrowest widths $W_1$ and $W_2$ of about 0.5 $\mu$m and about 0.35 $\mu$m respectively. The distance between the adjacent gate electrodes 92 is about 0.3 $\mu$m.

The wiring layers 58 are formed to be in contact with the side surfaces 51c and 51f and the bottom surfaces 51b of the projecting parts 51a. The wiring layers 58 are formed also on inversely tapered parts 51e resulting from the difference between the largest and narrowest widths $W_1$ and $W_2$. A silicon oxide film 53 is formed to cover the projecting parts 51a and the wiring layers 58.

The semiconductor device having the aforementioned structure is provided with the wiring layers 58 also on portions along the side surfaces 51c and 51f of the projecting parts 51a, i.e., the inversely tapered parts 51e, whereby the wiring layers 58 can be increased in sectional area and reduced in conductive resistance.

Figure 23:
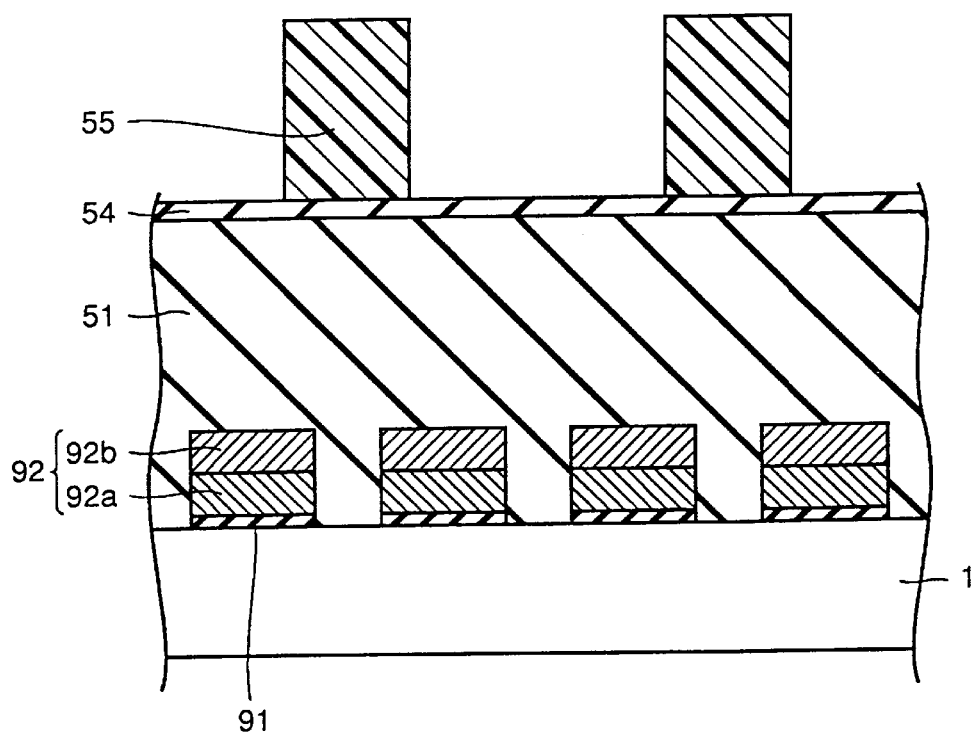
FIGS. 23 to 28 are sectional views showing first to sixth steps of a method of fabricating the semiconductor device shown in FIG. 22.

A method of fabricating the semiconductor device shown in FIG. 22 is now described. Referring to FIG. 23, a thermal oxide film, a doped polysilicon film and a tungsten silicide film are formed on the silicon substrate 1. The tungsten silicide film, the doped polysilicon film and the thermal oxide film are patterned in prescribed shapes, thereby forming the gate electrodes 92 consisting of the tungsten silicide layers 92b and the doped polysilicon layers 92a and the gate oxide films 91. The silicon oxide film 51 is formed to cover the gate electrodes 92. A polysilicon layer 54 having a high insulation property, which is doped with no impurity, is formed on the silicon oxide film 51 by CVD. Resist patterns 55 are formed on the polysilicon layer 54.

Figure 24:
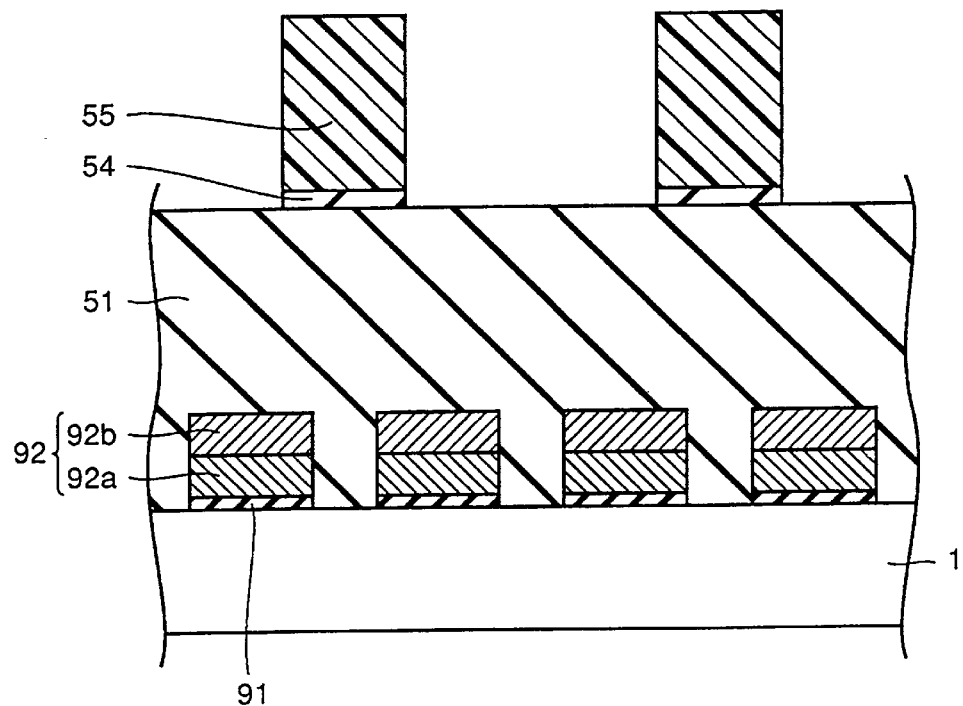

Referring to FIG. 24, the polysilicon layer 54 is anisotropically etched with chlorine gas along the resist patterns 55.

Figure 25:
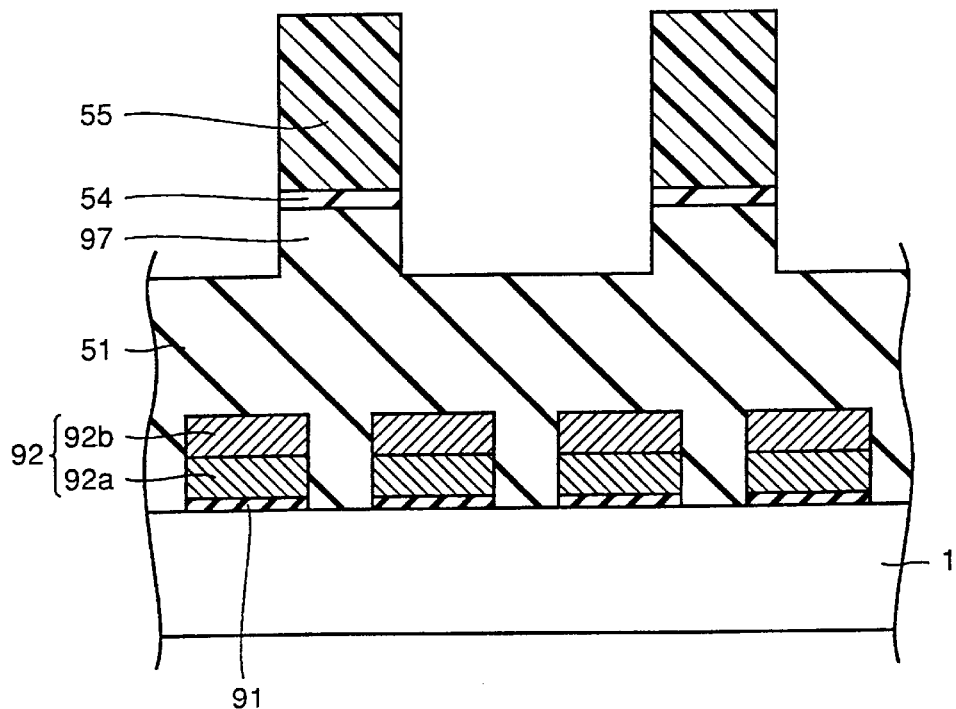

Referring to FIG. 25, the silicon oxide film 51 is isotropically etched with $CF_4$ gas, thereby forming convex parts 97.

Figure 26:
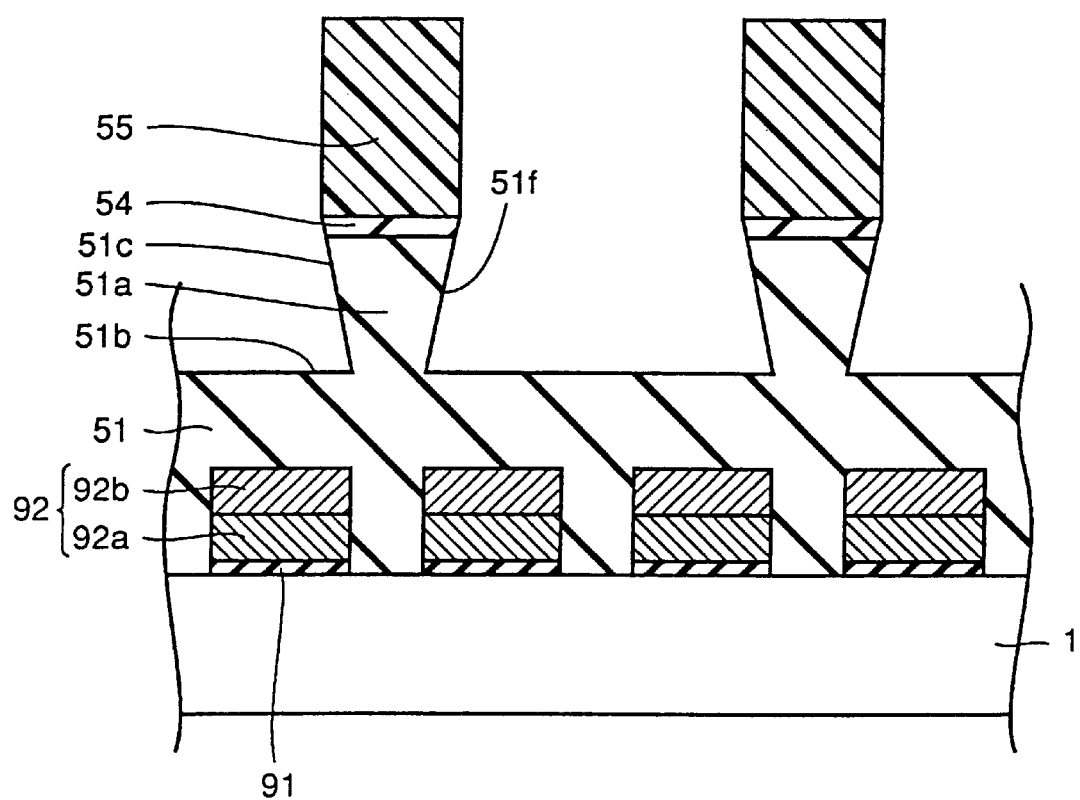

Referring to FIG. 26, the silicon oxide film 51 is isotropically etched with aqueous hydrofluoric acid while leaving the resist patterns 55, thereby forming the projecting parts 51a. Thereafter the polysilicon layer 54 is removed.

Figure 27:
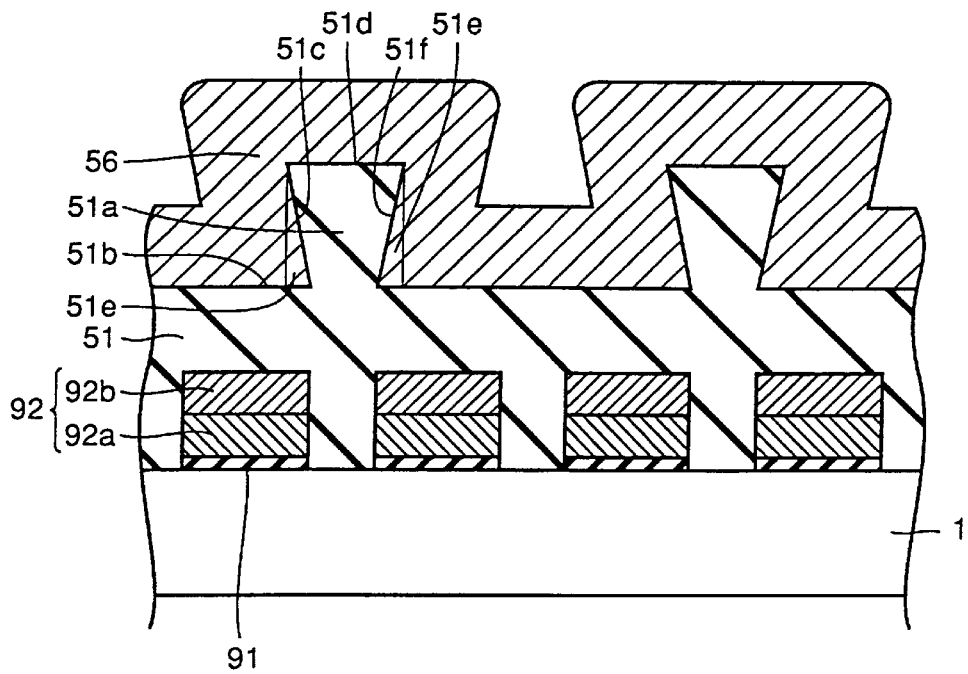

Referring to FIG. 27, an aluminum layer 56 is formed by sputtering to cover the projecting parts 51a.

Figure 28:
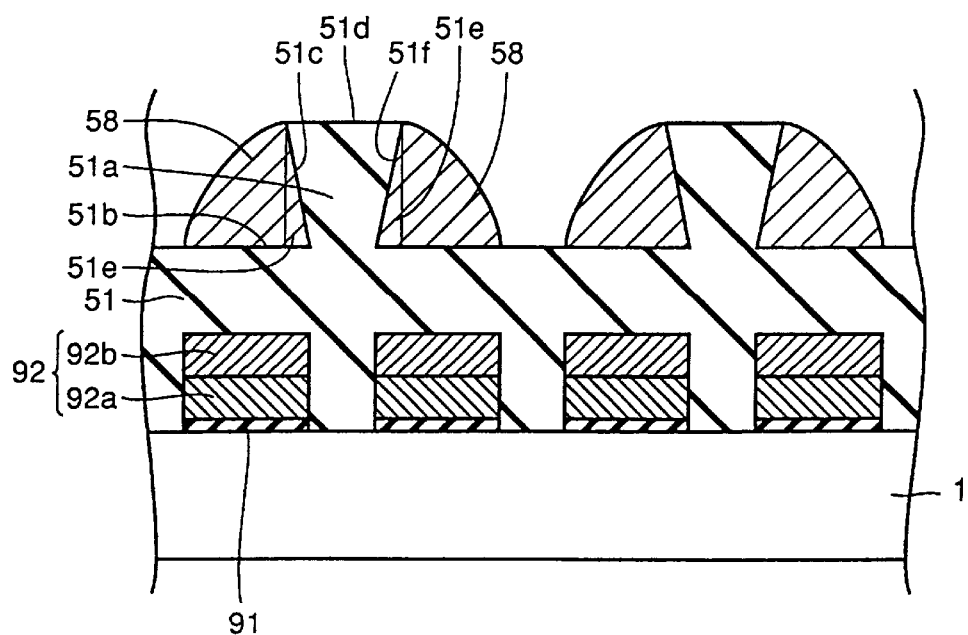

Referring to FIG. 28, the aluminum layer 56 is etched back overall, thereby forming the wiring layers 58 which are in contact with the projecting parts 51a.

Referring again to FIG. 22, the silicon oxide film 53 is formed to cover the projecting parts 51a and the wiring layers 58, thereby completing the semiconductor device.

According to this fabrication method, the wiring layers 58 having shapes along the projecting parts 51a of the silicon oxide film 51, which can be readily finely worked, are formed by etching back the aluminum layer 56 overall. Therefore, the wiring layers 58 can be finely formed in high accuracy as compared with the case of forming a resist pattern on the aluminum layer 56 and forming the wiring layers 58 along this resist pattern. Further, the conductive layers entering the inversely tapered parts 51e in the step of etching back the aluminum layer 56 are hardly etched, to remain in the inversely tapered parts 51e in a high probability. Therefore, the wiring layers 58 are hardly disconnected, to improve the reliability of the semiconductor device.

Embodiment 6

Figure 29:
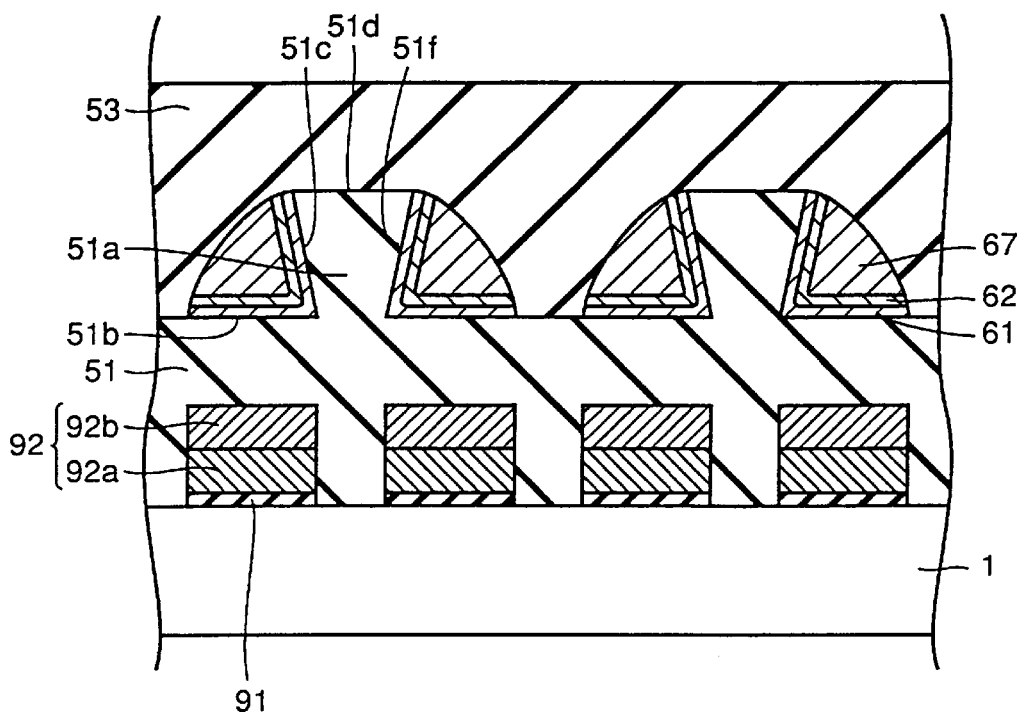
FIG. 29 is a sectional view of a semiconductor device according to an embodiment 6 of the present invention.

In a semiconductor device according to an embodiment 6 of the present invention shown in FIG. 29, titanium layers 61, titanium nitride layers 62 and tungsten layers 67 are formed to be in contact with projecting parts 51a. As to the remaining points, the semiconductor device shown in FIG. 29 is similar to that shown in FIG. 22.

This semiconductor device attains an effect similar to that of the semiconductor device shown in FIG. 22.

Figure 30:
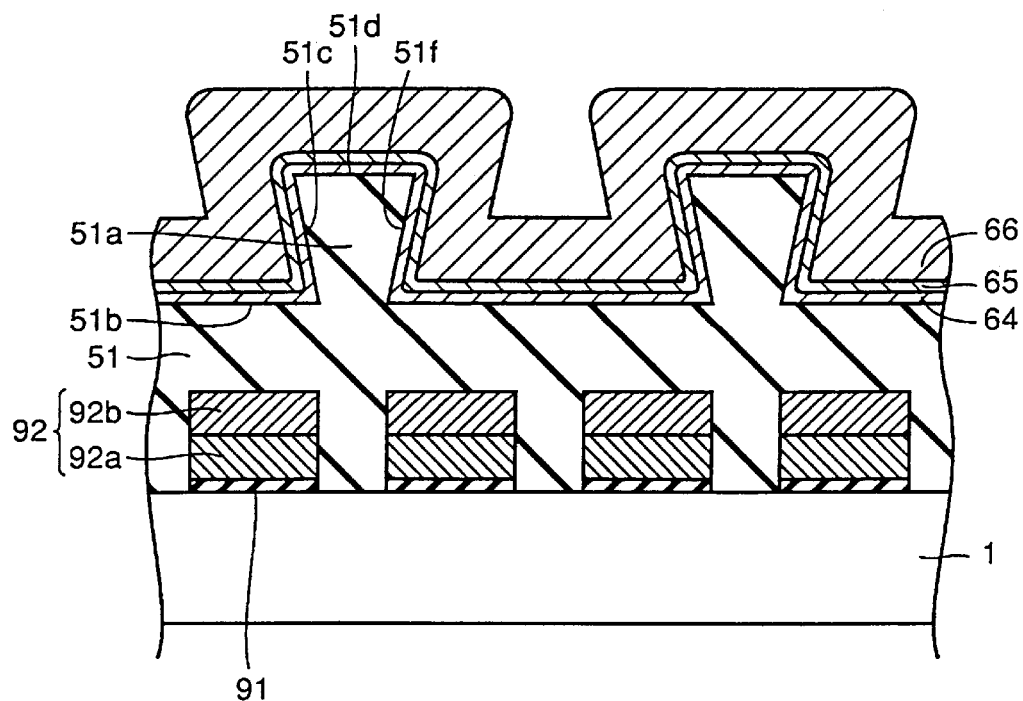
FIG. 30 is a sectional view showing a step of a method of fabricating the semiconductor device shown in FIG. 29.

A method of fabricating the semiconductor device shown in FIG. 29 is now described. Referring to FIG. 30, gate oxide films 91, doped polysilicon layers 92a, tungsten silicide layers 92b and a silicon oxide film 51 having the projecting parts 51a are formed on a silicon substrate 1 through steps similar to those of the embodiment 5 shown in FIGS. 23 and 24. A titanium layer 64 of about 10 Å in thickness and a titanium nitride layer 65 of about 15 Å in thickness are formed by sputtering to cover the projecting parts 51a of the silicon oxide film 51. A tungsten layer 66 is formed on the titanium nitride layer 65 by CVD.

Referring again to FIG. 29, the tungsten layer 66, the titanium nitride layer 65 and the titanium layer 64 are etched back overall, thereby forming the tungsten layers 67, the titanium nitride layers 62 and the titanium layers 61. A silicon oxide film 53 is formed to cover the tungsten layers 67, thereby completing the semiconductor device shown in FIG. 29.

Embodiment 7

Figure 31:
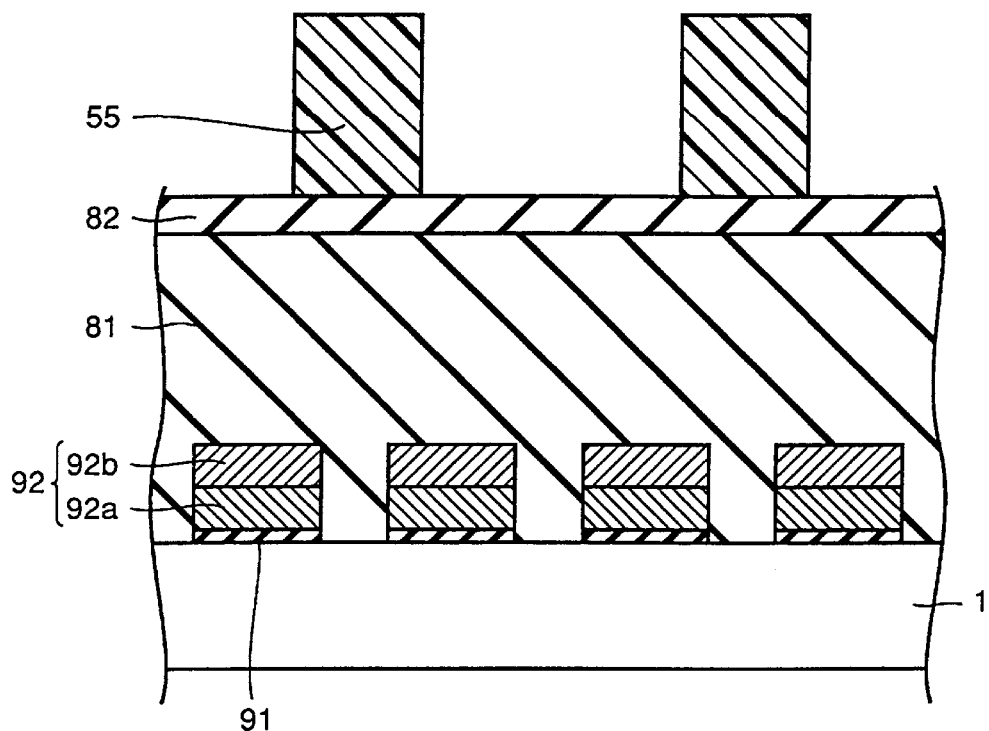
FIGS. 31 to 33 are sectional views showing first to sixth steps of another method of fabricating the semiconductor device shown in FIG. 22.

Referring to FIG. 31 showing another method of fabricating the semiconductor device shown in FIG. 22, gate oxide films 91, doped polysilicon layers 92a and tungsten silicide layers 92b are formed on a silicon substrate 1, similarly to the method according to the embodiment 5. A silicon oxide film 81 serving as a first insulator film consisting of BPSOG (borophospho-spin on glass) is formed to cover gate electrodes 92. A silicon oxide film 82 serving as a second insulator film of TEOS (tetraethyl orthosilicate) is formed on the silicon oxide film 81. The silicon oxide film 82 is hard to isotropically etch as compared with the silicon oxide film 81. Resist patterns 55 are formed on the silicon oxide film 82.

Figure 32:
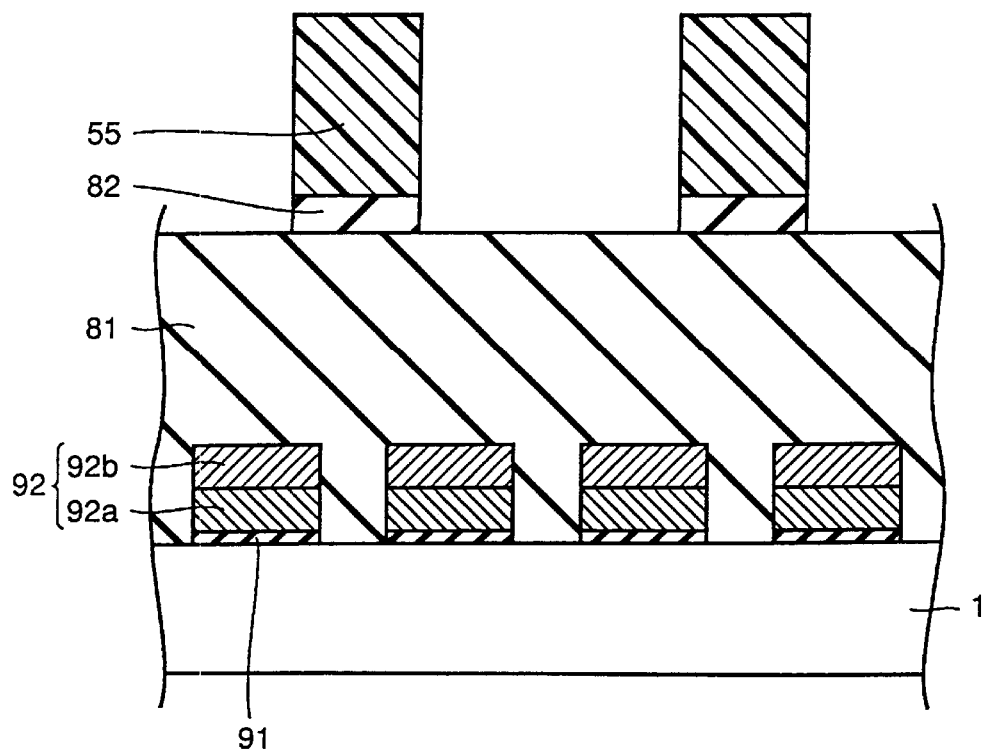

Referring to FIG. 32, the silicon oxide film 82 is isotropically etched with aqueous hydrofluoric acid through the resist patterns 55 serving as masks.

Figure 33:
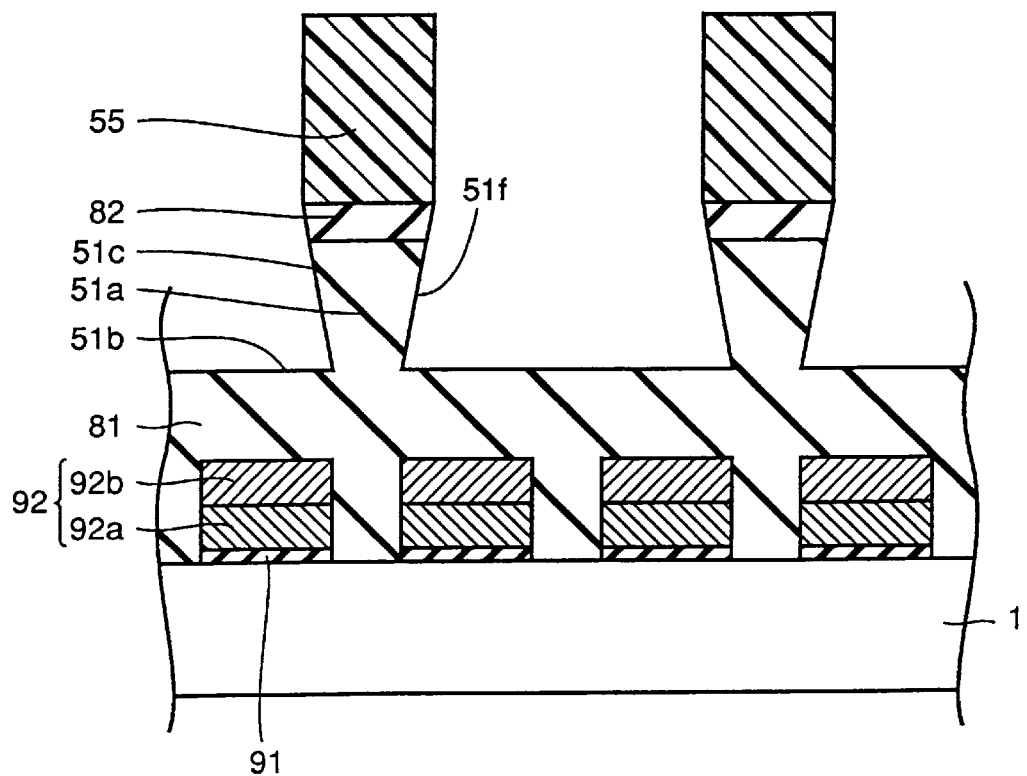
Figure 34:
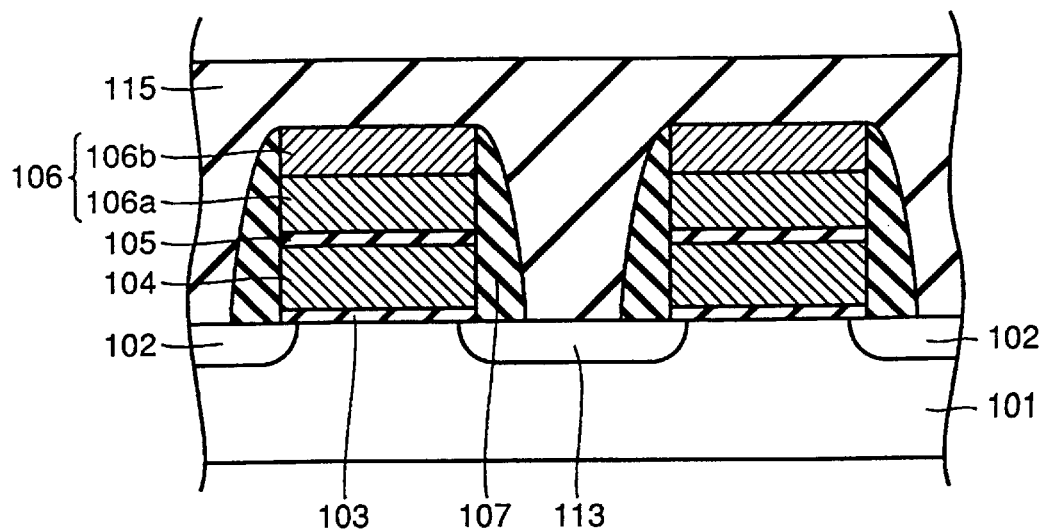
FIG. 34 is a sectional view of memory cells of a conventional flash memory.
Figure 35:
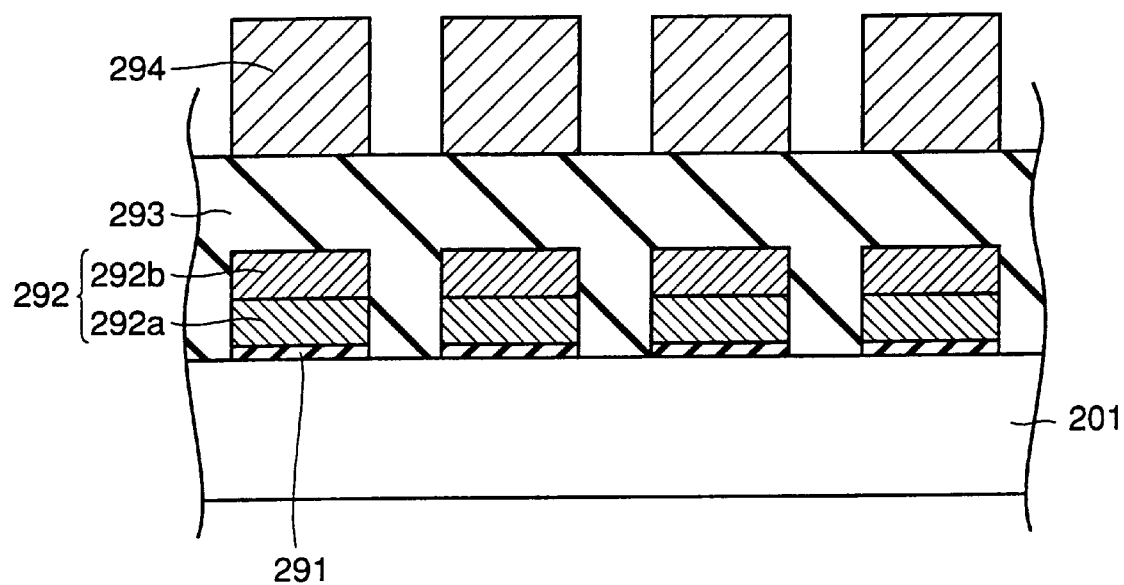
FIG. 35 is a sectional view of wiring layers formed on gate electrodes.

Referring to FIG. 33, the silicon oxide film 81 is further isotropically etched with aqueous hydrofluoric acid. At this time, the silicon oxide film 81, which is easy to etch, is remarkably etched as separating from the resist patterns 55 downward. Thus, the silicon oxide film 81 is provided with inversely tapered projecting parts 51a.

Referring to FIGS. 27 and 22 showing the semiconductor device according to the embodiment 5 of the present invention, wiring layers 58 and a silicon oxide film 53 are formed thereby completing the semiconductor device shown in FIG. 22. In this case, the silicon oxide films 81 and 82 correspond to the silicon oxide film 51 shown in FIG. 22. According to this method, the semiconductor device shown in FIG. 22 can be fabricated through simple steps without changing etching from anisotropic one to isotropic one.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate having a major surface;
    a first conductive layer being formed on a portion of said major surface of said semiconductor substrate to extend in one direction;
    an interlayer isolation film being formed on said major surface of said semiconductor substrate and having a trench reaching said first conductive layer, said trench being defined by opposite side walls of said interlayer isolation film to extend in one direction along said conductive layer; and
    a second conductive layer being formed on said opposite side walls of said trench,
    a part of said second conductive layer being in contact with a partial surface of said first conductive layer while exposing another partial surface of said first conductive layer.

2. The semiconductor device in accordance with claim 1, further comprising an electrode layer being formed on said major surface of said semiconductor substrate to extend along said first conductive layer.

3. The semiconductor device in accordance with claim 1, wherein said semiconductor substrate has a concave part communicating with said trench, said concave part is defined by a side wall of said first conductive layer, and said second conductive layer is formed on side walls of said trench and said concave part to be in contact with said first conductive layer.

4. The semiconductor device in accordance with claim 1, wherein said first and second conductive layers are source lines.

5. A semiconductor device comprising:
    a semiconductor substrate having a major surface;
    an electrode layer being formed on said major surface of said semiconductor substrate to extend in one direction and having a side wall;
    a first conductive layer being formed on a portion of said major surface of said semiconductor substrate to extend along said electrode layer;
    a side wall insulator film being formed on said side wall of said electrode layer; and
    a second conductive layer being formed on said side wall insulator film,
    a part of said second conductive layer being in contact with a partial surface of said first conductive layer while exposing another partial surface of said first conductive layer.

6. The semiconductor device in accordance with claim 5, further comprising a protective insulator film being formed between said second conductive layer and said side wall insulator film.

7. The semiconductor device in accordance with claim 5, wherein said first and second conductive layers are source lines.

8. A semiconductor device comprising:
    a semiconductor substrate having a major surface;
    a first conductive layer being formed on said major surface of said semiconductor substrate to extend in one direction;
    an insulating layer having a projecting part being formed along the longitudinal direction of said first conductive layer and covering said first conductive layer; and
    a second conductive layer being formed on said insulator film along the longitudinal direction of said first conductive layer, said projecting part of said insulator film comprising opposing side surfaces projecting upwardly and diverging to a top surface such that the distance between said opposing side surfaces increases toward said top surface, said second conductive layer being formed along upper portions of said side surfaces.

9. The semiconductor device in accordance with claim 8, wherein said second conductive layer includes tungsten.

* * * * *